(12) United States Patent
Momose

(10) Patent No.: US 11,647,589 B2
(45) Date of Patent: May 9, 2023

(54) WIRING BOARD

(71) Applicant: SHINKO ELECTRIC INDUSTRIES CO., LTD., Nagano (JP)

(72) Inventor: Shuhei Momose, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/443,034

(22) Filed: Jul. 20, 2021

(65) Prior Publication Data

US 2022/0039260 A1    Feb. 3, 2022

(30) Foreign Application Priority Data

Jul. 29, 2020   (JP) .............................. JP2020-128108

(51) Int. Cl.
*H05K 1/16* (2006.01)
*H01L 23/498* (2006.01)
(Continued)

(52) U.S. Cl.
CPC ........... *H05K 1/165* (2013.01); *H01L 21/486* (2013.01); *H01L 23/49827* (2013.01);
(Continued)

(58) Field of Classification Search
CPC ...... H05K 1/0296; H05K 1/0298; H05K 1/09; H05K 1/11; H05K 1/111; H05K 1/112; H05K 1/113; H05K 1/115; H05K 1/116; H05K 1/18; H05K 1/181; H05K 2201/02; H05K 2201/0203; H05K 2201/0212; H05K 2201/0215; H05K 2201/0344;
(Continued)

(56) References Cited

U.S. PATENT DOCUMENTS 6,740,411 B2 * 5/2004  Kojima ............ H01L 23/49827
                                                                        428/416
2009/0126983 A1    5/2009  Harvey et al.
(Continued)

FOREIGN PATENT DOCUMENTS

JP        2011-216519        10/2011
JP        2019-220504        12/2019

OTHER PUBLICATIONS

Office Action dated Dec. 20, 2022 with respect to the related U.S. Appl. No. 17/568,120.
(Continued)

*Primary Examiner* — Timothy J Thompson
*Assistant Examiner* — John B Freal
(74) *Attorney, Agent, or Firm* — IPUSA, PLLC

(57) ABSTRACT

A wiring board includes an insulating base including a first principal surface, a second principal surface opposite to the first principal surface, and a first through hole penetrating the insulating base from the first principal surface to the second principal surface, a functional material provided inside the first through hole, a first insulating layer covering the first principal surface, and a first surface of the functional material, and a second insulating layer covering the second principal surface, and a second surface of functional material. A second through hole is formed in the first insulating layer, the functional material, and the second insulating layer, and a conductive layer is formed on a wall surface of the second through hole.

14 Claims, 15 Drawing Sheets

(51) Int. Cl.
 *H01L 23/58* (2006.01)
 *H05K 1/11* (2006.01)
 *H01L 21/48* (2006.01)
 *H05K 3/42* (2006.01)
 *H05K 3/06* (2006.01)

(52) U.S. Cl.
 CPC .............. *H01L 23/58* (2013.01); *H05K 1/115* (2013.01); *H05K 3/06* (2013.01); *H05K 3/426* (2013.01); *H05K 2201/0347* (2013.01); *H05K 2201/0959* (2013.01); *H05K 2203/072* (2013.01); *H05K 2203/0723* (2013.01)

(58) Field of Classification Search
 CPC ... H05K 2201/0347; H05K 2201/0364; H05K 2201/09036; H05K 2201/09045; H05K 2201/09054; H05K 2201/09481; H05K 2201/095; H05K 2201/09509; H05K 2201/09518; H05K 2201/09545; H05K 2201/0959
 See application file for complete search history.

(56) References Cited

U.S. PATENT DOCUMENTS

| | | | |
|---|---|---|---|
| 2009/0225525 A1* | 9/2009 | Mano ................... | H05K 1/0233 361/760 |
| 2009/0294161 A1* | 12/2009 | Yoshimura ........... | H05K 3/4641 174/258 |
| 2015/0213946 A1* | 7/2015 | Mano ..................... | H01F 17/04 336/200 |
| 2019/0274217 A1* | 9/2019 | Zhang ............... | H01L 23/49827 |
| 2019/0385777 A1* | 12/2019 | Kodama ................. | H01F 27/24 |
| 2020/0335270 A1 | 10/2020 | Kodama et al. | |
| 2022/0039260 A1 | 2/2022 | Momose | |
| 2022/0217844 A1 | 7/2022 | Shirotori | |

OTHER PUBLICATIONS

Office Action dated Oct. 13, 2022 issued with respect to the related U.S. Appl. No. 17/444,216.

* cited by examiner

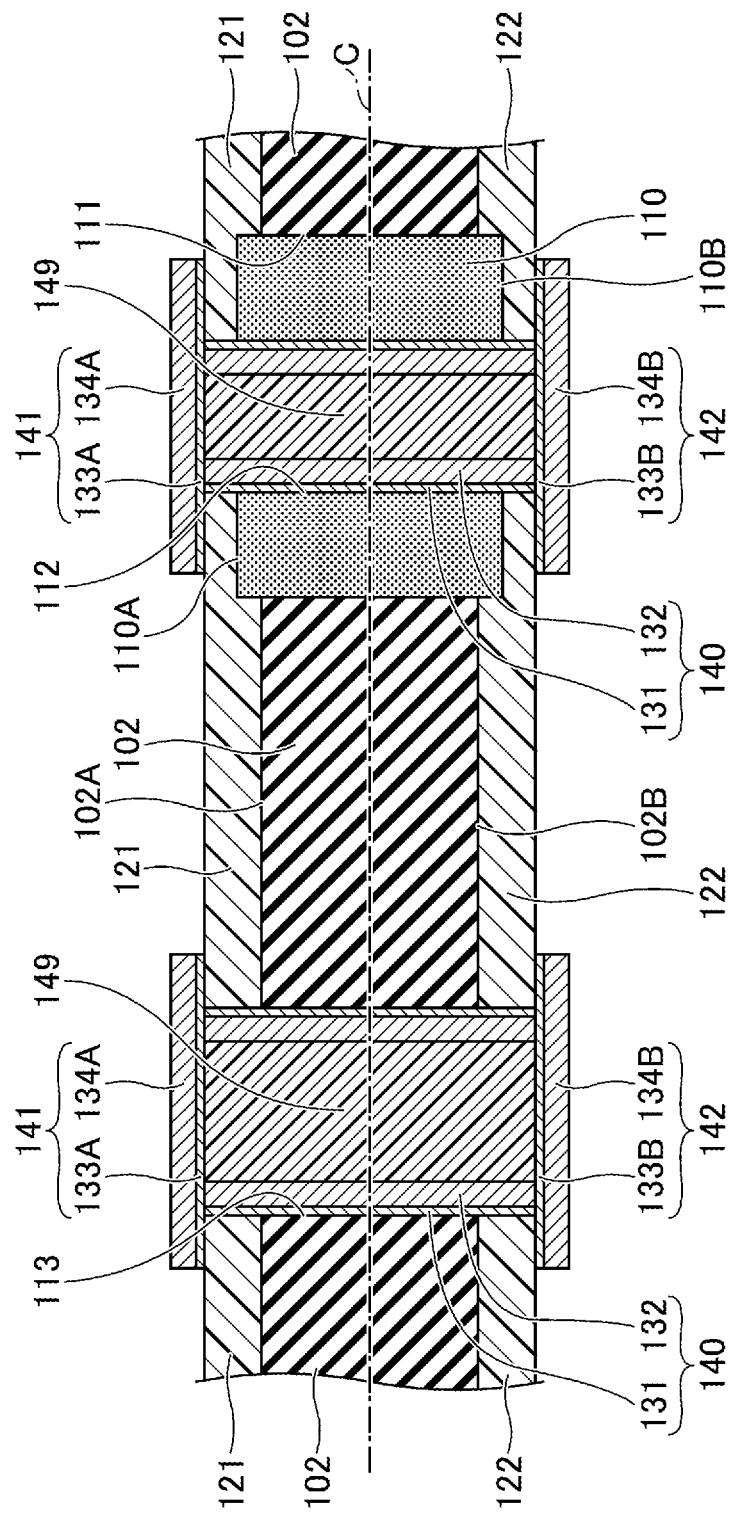

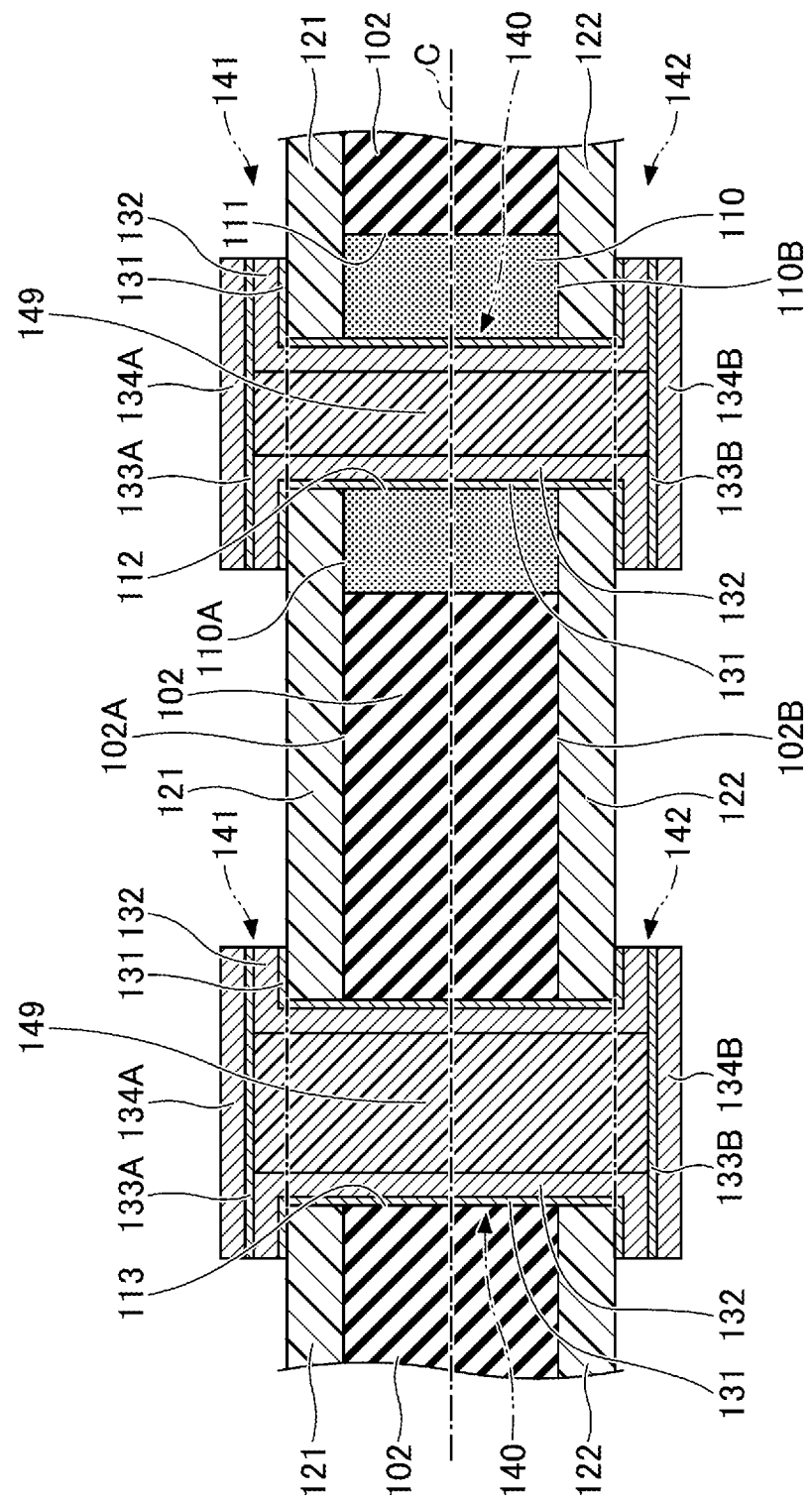

ND BOARD

CROSS-REFERENCE TO RELATED APPLICATIONS

This application is based upon and claims priority to Japanese Patent Application No. 2020-128108, filed on Jul. 29, 2020, the entire contents of which are incorporated herein by reference.

FIELD

Certain aspects of the embodiments discussed herein are related to wiring boards, and methods for manufacturing the wiring boards.

BACKGROUND

As one example of the wiring board, Japanese Laid-Open Patent Publication No. 2019-220504 proposes an inductor built-in substrate having a magnetic resin embedded inside a through hole of a core substrate.

In the conventional wiring board including the magnetic resin, an interconnect layer directly connected to the through hole of the core substrate is inevitably thick, and it is difficult to form a fine pattern on the interconnect layer. In addition, the thicker the interconnect layer becomes, the more likely a thickness variation occurs. If the thickness variation occurs, an unetched portion may occur during patterning of the interconnect layer, thereby deteriorating the yield.

SUMMARY

Accordingly, it is an object in one aspect of the embodiments to provide a wiring board having a fine interconnect layer, and a method for manufacturing the wiring boards.

According to one aspect of the embodiments, a wiring board includes an insulating base including a first principal surface, a second principal surface opposite to the first principal surface, and a first through hole penetrating the insulating base from the first principal surface to the second principal surface; a functional material provided inside the first through hole; a first insulating layer covering the first principal surface, and a first surface of the functional material; a second insulating layer covering the second principal surface, and a second surface of functional material; a second through hole formed in the first insulating layer, the functional material, and the second insulating layer; a conductive layer formed on a wall surface of the second through hole.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 2 is a cross sectional view illustrating a conductive layer, a first interconnect layer, and a second interconnect layer according to the first embodiment.

FIG. 14 is a cross sectional view illustrating the magnetic material according to a fourth embodiment.

DESCRIPTION OF EMBODIMENTS

Figure 1:
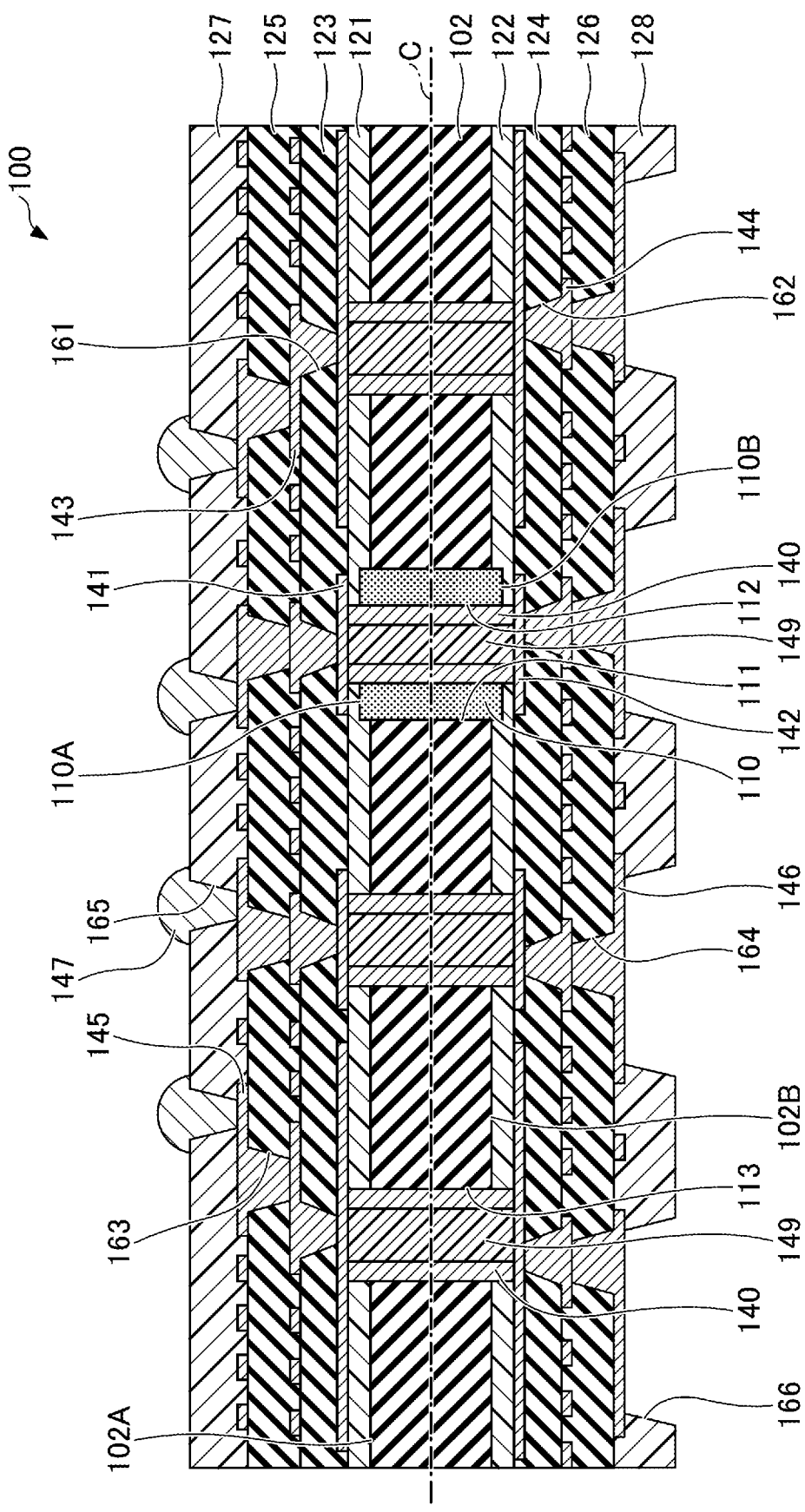
FIG. 1 is a cross sectional view illustrating a structure of a wiring board according to a first embodiment.

Preferred embodiments of the present invention will be described with reference to the accompanying drawings. In the drawings, those constituent elements having substantially the same functions or structures are designated by the same reference numerals, and a repeated description of such constituent elements may be omitted.

A description will now be given of a wiring board according to each embodiment, and a method for manufacturing the wiring board according to each embodiment, by referring to the drawings.

First Embodiment

A first embodiment will be described. The first embodiment relates to the wiring board.

[Structure of Wiring Board]

First, a structure of the wiring board will be described. FIG. 1 is a cross sectional view illustrating the structure of the wiring board according to the first embodiment.

As illustrated in FIG. 1, a wiring board 100 according to the first embodiment includes an insulating base 102, as a support. The base 102 may be formed of an insulating material, such as a glass epoxy resin, a bismaleimide triazine (BT) resin, or the like. The base 102 includes a first principal surface 102A, and a second principal surface 102B opposite the first principal surface 102A. A first through hole 111 is formed to penetrate the base 102 in a thickness direction of the base 102, from the first principal surface 102A to the second principal surface 102B. For example, the first through hole 111 may have a diameter in a range of 350 μm to 450 μm.

A magnetic material 110 is provided inside the first through hole 111. The magnetic material 110 includes, a resin, such as an epoxy resin or the like, and magnetic particles, such as iron fillers or the like, dispersed in the resin. The magnetic material 110 includes a first surface 110A on the side closer to the first principal surface 102A, and a second surface 110B on the side closer to the second principal surface 102B. In the first embodiment, the magnetic material 110 is thicker than the base 102, and the magnetic material 110 protrudes from the first principal surface 102A and the second principal surface 102B. That is, a distance from a center C along the thickness direction of the base 102 to the first surface 110A, is greater than a distance from the center C to the first principal surface 102A. A distance from the center C to the second surface 110B, is greater than a distance from the center C to the second principal surface 102B.

A first insulating layer 121, which covers the first principal surface 102A and the first surface 110A of the magnetic material 110, is provided on the first principal surface 102A and the first surface 110A. A second insulating layer 122, which covers the second principal surface 102B and the second surface 110B of the magnetic material 110, is provided on the second principal surface 102B and the second surface 110B. For example, the first insulating layer 121 and the second insulating layer 122 are made of an epoxy film including a filler. For example, the first insulating layer 121 and the second insulating layer 122 may have thicknesses in a range of 30 μm and 60 μm.

A second through hole 112 is formed to penetrate the first insulating layer 121, the magnetic material 110, and the second insulating layer 122, in the thickness direction of these layers. The second through hole 112 has a diameter smaller than the diameter of the first through hole 111. For example, the second through hole 112 may have a diameter in a range of 150 μm to 250 μm. A conductive layer 140 is provided on a wall surface of the second through hole 112. An insulative filler material 149 is provided to fill the inner side of the conductive layer 140 at the second through hole 112. For example, the filler material 149 main include a resin. The filler material 149 may further include a filler.

A third through hole 113 is formed to penetrate the first insulating layer 121, the base 102, and the second insulating layer 122 in the thickness direction of these layers. The third through hole 113 is formed at a position separated from the magnetic material 110 in an in-plane direction which is perpendicular to the thickness direction of the base 102. For example, the third through hole 113 may have a diameter in a range of 150 μm to 250 μm. The conductive layer 140 is also provided on a wall surface of the third through hole 113. The filler material 149 is provided to fill the inner side of the conductive layer 140 at the third through hole 113.

A first interconnect layer 141 is formed on a surface of the first insulating layer 121, and a second interconnect layer 142 is formed on a surface of the second insulating layer 122. The first interconnect layer 141 and the second interconnect layer 142 connect to the conductive layer 140. That is, the first interconnect layer 141 and the second interconnect layer 142 are connected to each other via the conductive layer 140.

A third insulating layer 123 is formed on the first insulating layer 121. The third insulating layer 123 includes a via hole 161 which is formed to reach a connection portion of the first interconnect layer 141. A third interconnect layer 143, which connects to the first interconnect layer 141 via a via conductor inside the via hole 161, is formed on the third insulating layer 123. Further, a fifth insulating layer 125 is formed on the third insulating layer 123. The fifth insulating layer 125 includes a via hole 163 which is formed to reach a connection portion of the third interconnect layer 143. A fifth interconnect layer 145, which connects to the third interconnect layer via a via conductor inside the via hole 163, is formed on the fifth insulating layer 125.

A solder resist layer 127 is formed on the fifth insulating layer 125. The solder resist layer 127 includes an opening 165 which reaches a connection portion of the fifth interconnect layer 145. A connection terminal 147, which protrudes above the solder resist layer 127 via the opening, is famed on the connection portion of the fifth interconnect layer 145. The connection terminal 147 may include a post, and a bump on top of the post. An electrode of a semiconductor chip is connected to the connection terminal 147.

A fourth insulating layer 124 is formed on the second insulating layer 122. The fourth insulating layer 124 includes a via hole 162 which is formed to reach a connection portion of the second interconnect layer 142. A fourth interconnect layer 144, which connects to the second interconnect layer 142 via a via conductor inside the via hole 162, is formed on the fourth insulating layer 124. Further, a sixth insulating layer 126 is formed on the fourth insulating layer 124. The sixth insulating layer 126 includes a via hole 164 which is formed to reach a connection portion of the fourth interconnect layer 144. A sixth interconnect layer 146, which connects to the fourth interconnect layer 144 via a via conductor inside the via hole 164, is formed on the sixth insulating layer 126.

A solder resist layer 128 is formed on the sixth insulating layer 126. The solder resist layer 128 includes an opening 166 which is formed to reach a connection portion of the sixth interconnect layer 146.

Next, details of the conductive layer 140, the first interconnect layer 141, and the second interconnect layer 142 will be described. FIG. 2 is a cross sectional view illustrating the conductive layer 140, the first interconnect layer 141, and the second interconnect layer 142 according to the first embodiment.

As illustrated in FIG. 2, the conductive layer 140 includes an electroless copper plating film 131, and an electrolytic copper plating film 132, which are laminated. The electroless copper plating film 131 is formed on a wall surface of the second through hole 112 and on a wall surface of the third through hole 113. The electrolytic copper plating film 132 is formed on electroless copper plating film 131. For example, the electroless copper plating film 131 may have a thickness in a range of 0.3 μm to 1.0 μm, and the electrolytic copper plating film 132 may have a thickness in a range of 10 μm to 50 μm. The filler material 149 fills the inner side of the electrolytic copper plating film 132 at the second through hole 112 and the third through hole 113. The electroless copper plating film 131, the electrolytic copper plating film 132, and the filler material 149 respectively have surfaces coinciding with the surface of the first insulating layer 121, and surfaces coinciding with the surface of the second insulating layer 122.

The first interconnect layer 141 includes an electroless copper plating film 133A, and an electrolytic copper plating film 134A, which are laminated. The electroless copper plating film 133A is formed on the surface (that is, the upper surface) of the first insulating layer 121, and on the surfaces (that is, first end surfaces) of the electroless copper plating film 131, the electrolytic copper plating film 132, and the filler material 149 coinciding with the upper surface of the first insulating layer 121. In other words, the first end surface (that is, the upper end surface) of the conductive layer 140 coincides with the upper surface of the first insulating layer 121, opposite to the lower surface of the insulating layer 121 covering the first principal surface 102A. The electrolytic copper plating film 134A is formed on electroless copper plating film 133A. For example, the electroless copper plating film 133A may have a thickness in a range of 0.3 µm to 1.0 µm, and the electrolytic copper plating film 134A may have a thickness in a range of 15 µm to 40 µm.

The second interconnect layer 142 includes an electroless copper plating film 133B, and an electrolytic copper plating film 134B, which are laminated. The electroless copper plating film 133B is formed on the surface (that is, the lower surface) of the second insulating layer 122, and on the surfaces (that is, second end surfaces) of the electroless copper plating film 131, the electrolytic copper plating film 132, and the filler material 149 coinciding with the lower surface of the second insulating layer 122. In other words, the second end surface (that is, the lower end surface) of the conductive layer 140 coincides with the lower surface of the second insulating layer 122, opposite to the upper surface of the second insulating layer 122 covering the second principal surface 102B. The electrolytic copper plating film 134B is formed on the electroless copper plating film 133B. For example, the electroless copper plating film 133B may have a thickness in a range of 0.3 µm to 1.0 µm, and the electrolytic copper plating film 134B may have a thickness in a range of 15 µm to 40 µm.

In the first embodiment, the thickness of the first interconnect layer 141 is equal to the total thickness of the electroless copper plating film 133A and the electrolytic copper plating film 134A, and the thickness of the second interconnect layer 142 is equal to the total thickness of the electroless copper plating film 133B and the electrolytic copper plating film 134B. The electroless copper plating film 133A is extremely thin compared to the electrolytic copper plating film 134A, and the electroless copper plating film 133B is extremely thin compared to the electrolytic copper plating film 134B. Hence, the thickness of the first interconnect layer 141 is substantially the same as the thickness of the electrolytic copper plating film 134A, and the thickness of the second interconnect layer 142 is substantially the same as the thickness of the electrolytic copper plating film 134B. For example, the thicknesses of the first interconnect layer 141 and the second interconnect layer 142 may be in a range of approximately 15 µm to approximately 40 µm. For this reason, the first interconnect layer 141 and the second interconnect layer 142 can easily be subjected to a fine pattern lithography. That is, fine patterns can easily be formed in the first interconnect layer 141 and the second interconnect layer 142. In addition, it is possible to reduce a variation (or inconsistency) in the thicknesses of the first interconnect layer 141 and the second interconnect layer 142, and to reduce an unetched portion from occurring during the patterning, as will be described later in conjunction with FIG. 7B. Accordingly, it is possible to reduce deterioration of the yield caused by the unetched portion.

[Method for Manufacturing Wiring Board]

Next, a method for manufacturing the wiring board according to the first embodiment will be described. FIG. 3 through FIG. 7 are cross sectional views illustrating the method for manufacturing the wiring board according to the first embodiment.

Figure 3A:
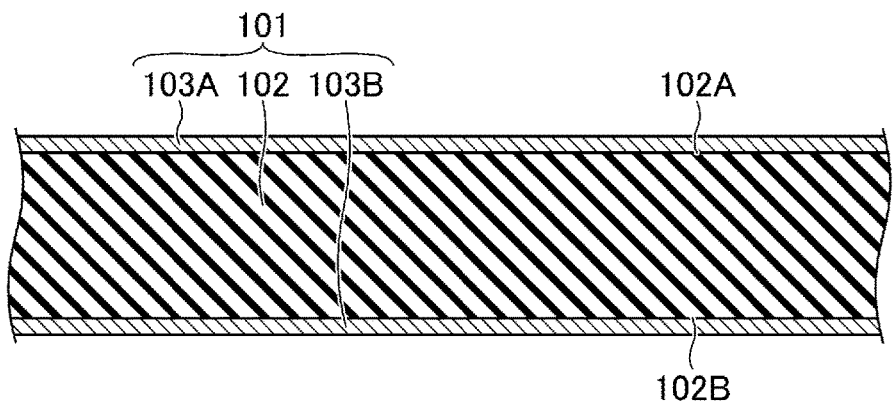
FIG. 3A, FIG. 3B, and FIG. 3C are cross sectional views (part 1) illustrating a method for manufacturing the wiring board according to the first embodiment.

First, as illustrated in FIG. 3A, a laminate 101, including the insulating base 102, the conductive film 103A, and the conductive film 103B, is prepared. The base 102 includes the first principal surface 102A, and the second principal surface 102B opposite to the first principal surface 102A. The conductive film 103A is provided on the first principal surface 102A, and the conductive film 103B is provided on the second principal surface 102B. For example, the conductive films 103A and 103B are copper foils. The laminate 101 forms a large substrate from which a plurality of wiring boards 100 can be singulated. In other words, the laminate 101 includes a plurality of regions (or areas) where structures, respectively corresponding to the wiring board 100, are formed.

Figure 3B:
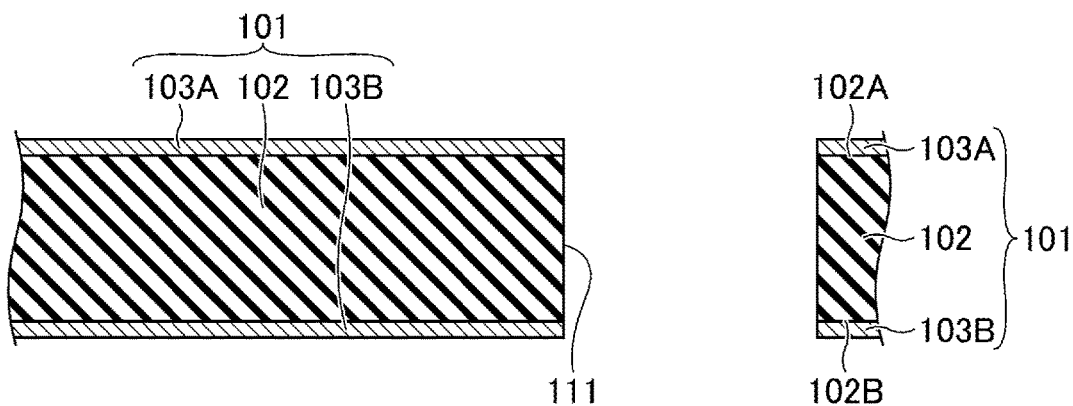

Next, as illustrated in FIG. 3B, the first through hole 111 is formed to penetrate the laminate 101 in a thickness direction of the laminate 101. The first through hole 111 penetrates the conductive film 103A, the base 102, and the conductive film 103B in the thickness direction of these layers. For example, the first through hole 111 may be formed by drilling, laser beam machining, or the like. Thereafter, the wall of the first through hole 111 is subjected to a desmear process. The desmear process removes the resin residue (or smear). For example, the desmear process may be performed using a potassium permanganate solution. For example, the first through hole 111 may have a diameter in a range of 350 µm to 450 µm.

Figure 3C:
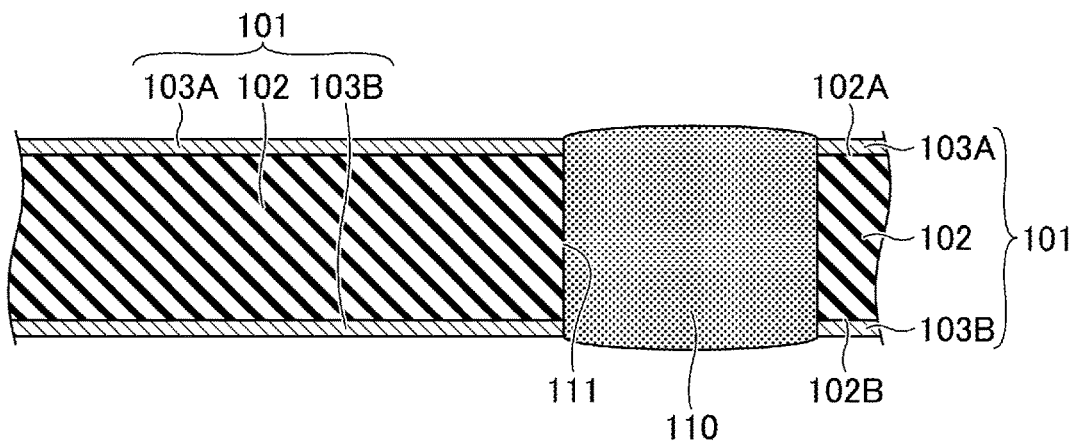

Thereafter, as illustrated in FIG. 3C, the magnetic material 110 is filled into the first through hole 111. For example, the magnetic material 110 may be filled so as to protrude from the surfaces of each of the conductive films 103A and 103B, in order to avoid insufficient filling of the first through hole 111.

Figure 4A:
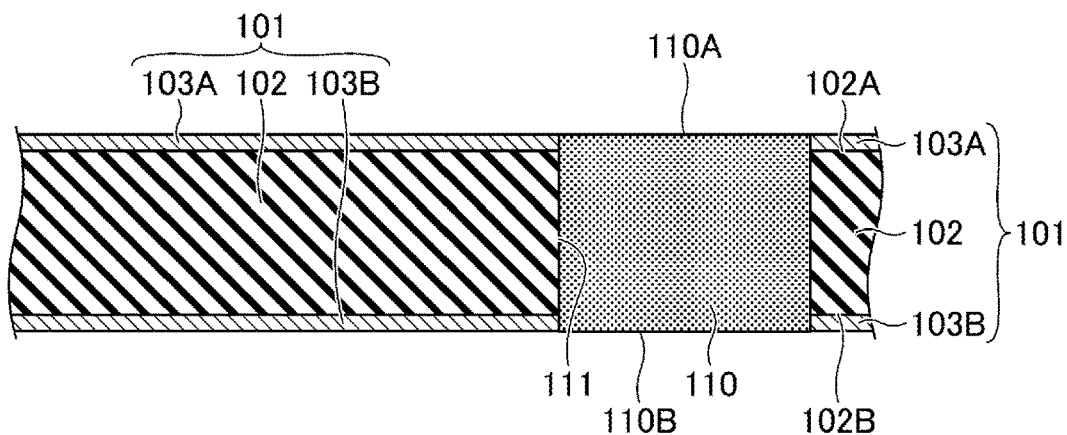
FIG. 4A, FIG. 4B, and FIG. 4C are cross sectional views (part 2) illustrating the method for manufacturing the wiring board according to the first embodiment.

Next, as illustrated in FIG. 4A, portions of the magnetic material 110 protruding from the surfaces of the conductive films 103A and 103B are removed by polishing. For example, the protruding portions of the magnetic material 110 may be removed by buffing or roll polishing. The magnetic material 110 after the polishing includes the first surface 110A which coincides with the surface of the conductive film 103A, and a surface 110B which coincides with the surface of the conductive film 103B.

Figure 4B:
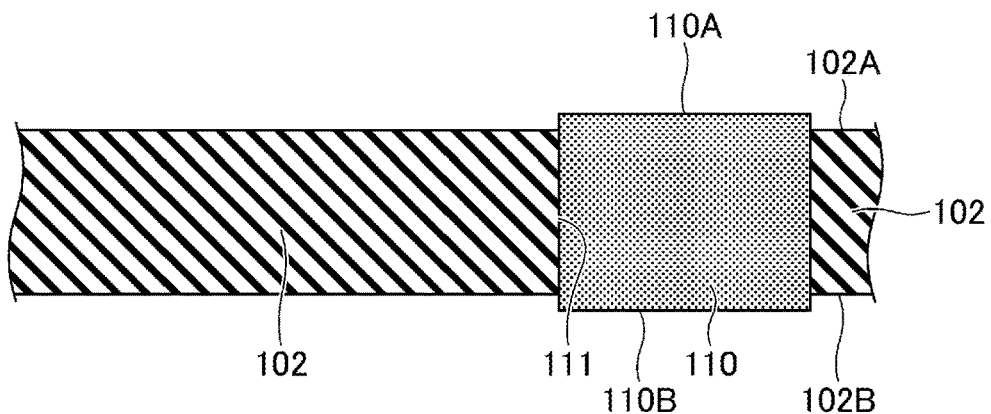

Next, as illustrated in FIG. 4B, the conductive films 103A and 103B are removed. As a result, the first principal surface 102A and the second principal surface 102B are exposed. For example, the conductive films 103A and 103B may be removed by wet etching using an acidic solution. Examples of the acidic solution may include a hydrogen peroxide ($H_2O_2$) solution, a sulfuric acid ($H_2SO_4$) solution, or the like.

Figure 4C:
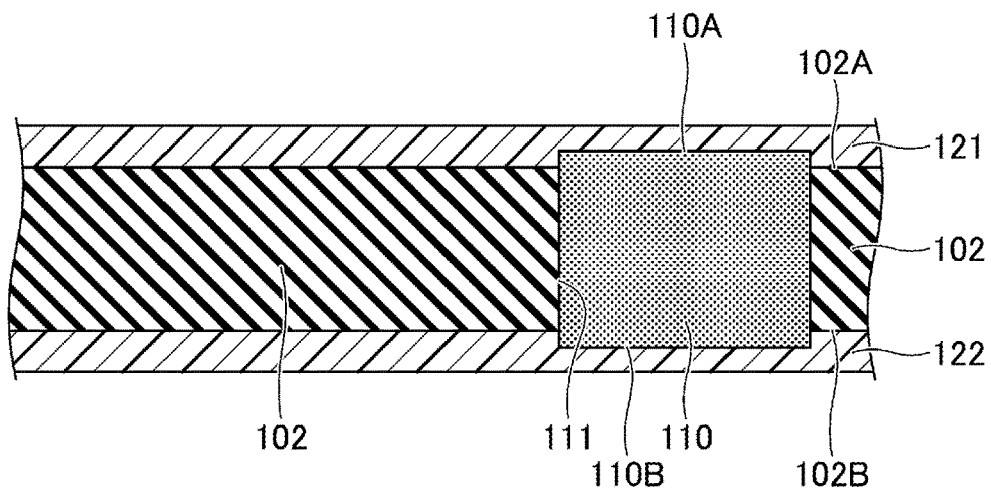

Next, as illustrated in FIG. 4C, the first insulating layer 121, which covers the first principal surface 102A and the first surface 110A of the magnetic material 110, is provided on the first principal surface 102A and the first surface 110A. The second insulating layer 122, which covers the second principal surface 102B and the second surface 110B of the magnetic material 110, is provided on the second principal surface 102B and the second surface 110B. An epoxy resin film including a filler may be adhered as the first insulating layer 121 and the second insulating layer 122. For example, the first insulating layer 121 and the second insulating layer 122 may have thicknesses in a range of 30 µm and 60 µm.

Figure 5A:
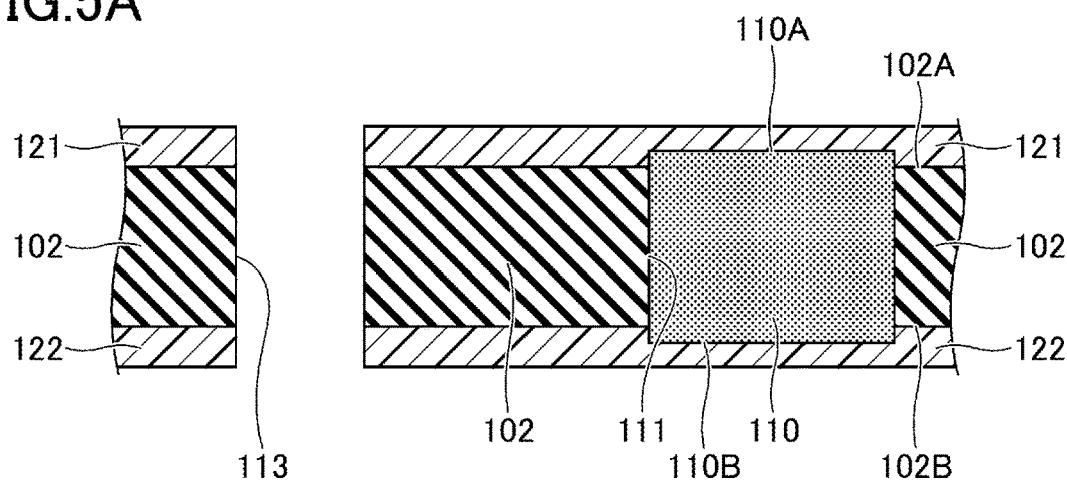
FIG. 5A, FIG. 5B, and FIG. 5C are cross sectional views (part 3) illustrating the method for manufacturing the wiring board according to the first embodiment.

Next, as illustrated in FIG. 5A, the third through hole 113 is formed to penetrate the first insulating layer 121, the base 102, and the second insulating layer 122 in the thickness direction of these layers. For example, the third through hole 113 may be famed by drilling, laser beam machining, or the like. Then, the desmear process is performed on the wall surface of the third through hole 113. For example, the third through hole 113 may have a diameter in a range of 150 µm to 250 µm.

Figure 5B:
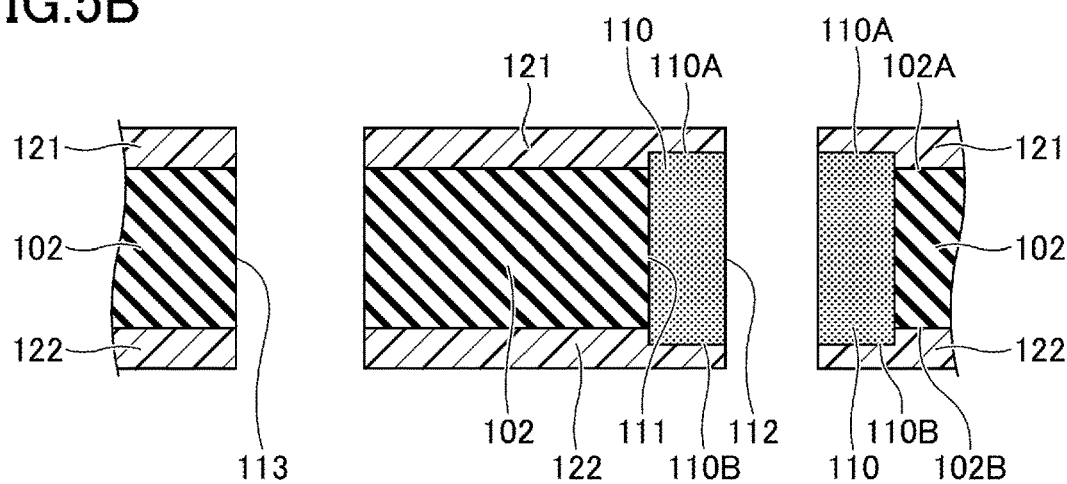

Thereafter, as illustrated in FIG. 5B, the second through hole 112 is formed to penetrate the first insulating layer 121, the magnetic material 110, and the second insulating layer 122 the thickness direction of these layers. The diameter of the second through hole 112 is smaller than the diameter of the first through hole 111. For example, the second through hole 112 may be formed by drilling, laser beam machining, or the like. For example, the second through hole 112 may have a diameter in a range of 150 µm to 250 µm. Then, the wall surface of the second through hole 112 is cleaned with water.

Figure 5C:
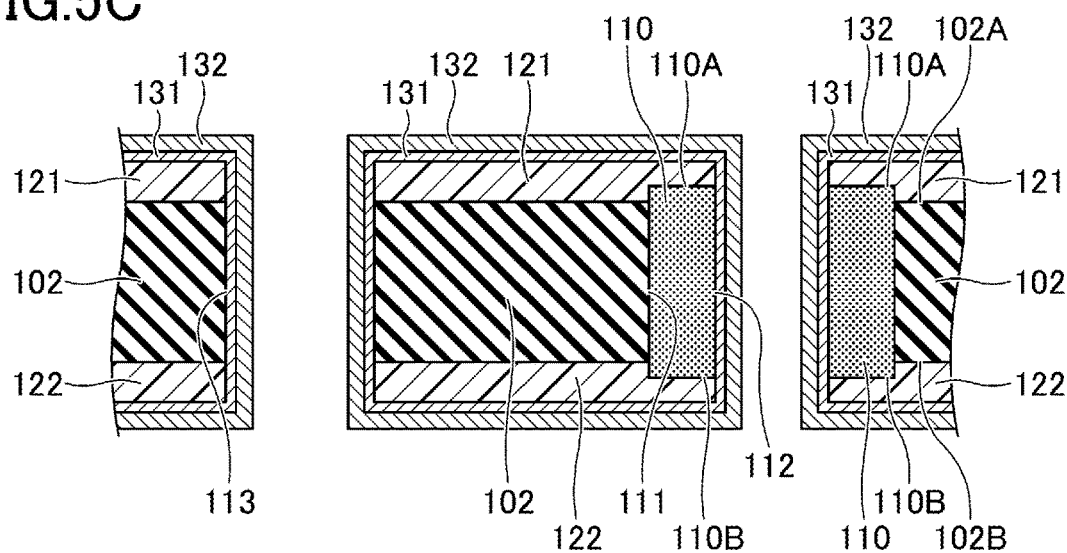

Next, as illustrated in FIG. 5C, the electroless copper plating film 131 is formed on the surface of the first insulating layer 121, the surface of the second insulating layer 122, the wall surface of the second through hole 112, and the wall surface of the third through hole 113. Thereafter, the electrolytic copper plating film 132 is formed on the electroless copper plating film 131, by electrolytic plating using the electroless copper plating film 131 as a plating feed line. For example, the electroless copper plating film 131 may have a thickness in a range of 0.3 µm to 1.0 µm, and the electrolytic copper plating film 132 may have a thickness in a range of 10 µm to 50 µm.

Figure 6A:
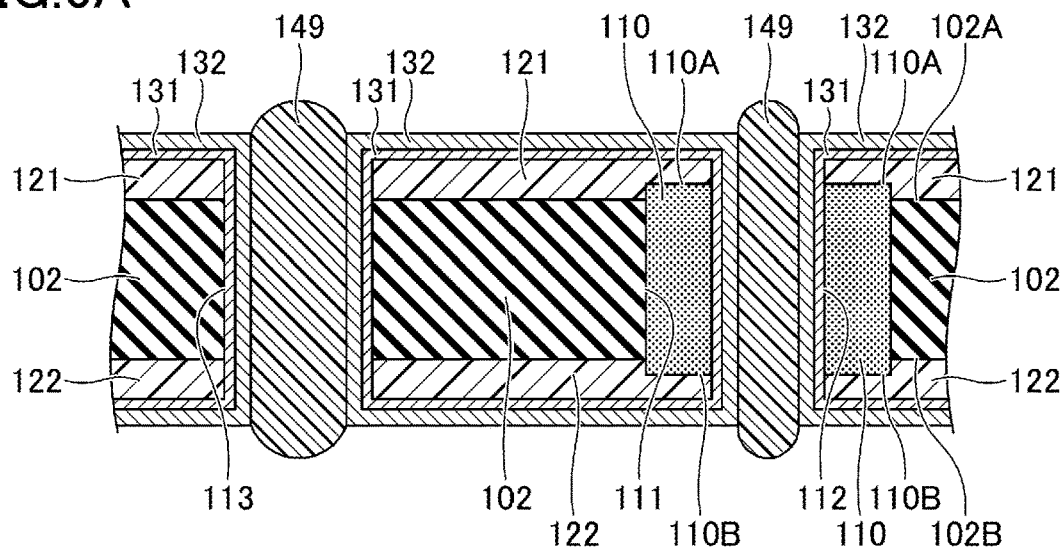
FIG. 6A, FIG. 6B, and FIG. 6C are cross sectional views (part 4) illustrating the method for manufacturing the wiring board according to the first embodiment.

Next, as illustrated in FIG. 6A, the filler material 149 is filled into the second through hole 112 and the third through hole 113. For example, the filler material 149 may be filled by screen printing. The filler material 149 is provided on the electrolytic copper plating film 132 inside the second through hole 112 and the third through hole 113. Then, the filler material 149 is cured. If the filler material 149 includes a thermosetting resin, such as an epoxy resin or the like, the filler material 149 may be cured by a heat treatment.

Figure 6B:
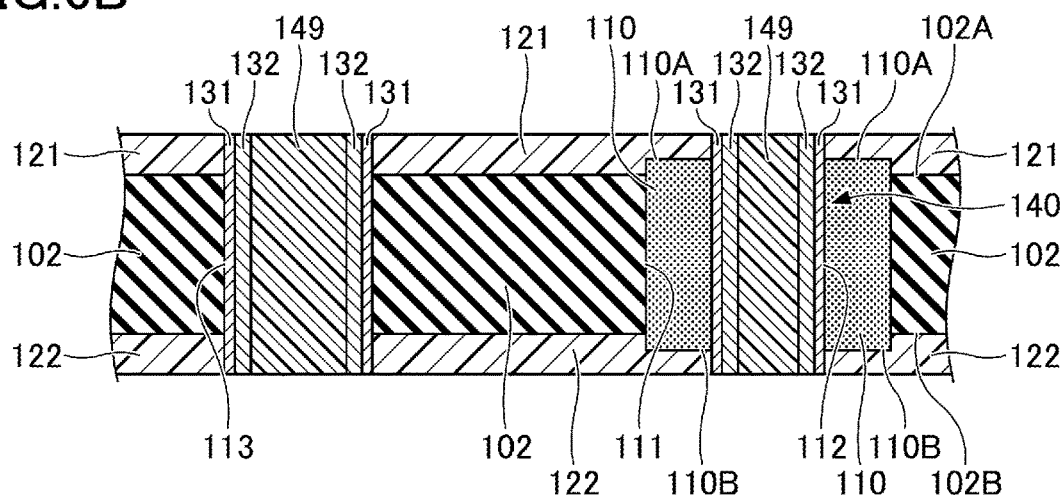

Thereafter, as illustrated in FIG. 6B, the electrolytic copper plating film 132, the electroless copper plating film 131, and the filler material 149 are polished on the side closer to the first principal surface 102A, until the surface of the first insulating layer 121 is exposed. In addition, the electrolytic copper plating film 132, the electroless copper plating film 131, and the filler material 149 are polished on the side closer to the second principal surface 102B, until the surface of the second insulating layer 122 is exposed. As a result, the electroless copper plating film 131, the electrolytic copper plating film 132, and the filler material 149 have surfaces which coincide with the surface of the first insulating layer 121, and also have surfaces which coincide with the surface of the second insulating layer 122. The electroless copper plating film 131 and electrolytic copper plating film 132, after the polishing, are included in conductive layer 140. For example, the electrolytic copper plating film 132, the electroless copper plating film 131, and the filler material 149 may be polished by a chemical mechanical polishing (CMP). The electrolytic copper plating film 132, the electroless copper plating film 131, and the filler material 149 may be polished as follows. First, portions of the electrolytic copper plating film 132 and the electroless copper plating film 131 on the surface of the first insulating layer 121, and portions of the electrolytic copper plating film 132 and the electroless copper plating film 131 on the surface of the second insulating layer 122, may be removed by wet etching. As a result, the surface of the first insulating layer 121, and the surface of the second insulating layer 122, are exposed. Then, portions of the filler material 149 protruding from the surface of the first insulating layer 121 and from the surface of the second insulating layer 122, are removed by buffing or roll polishing.

Figure 6C:
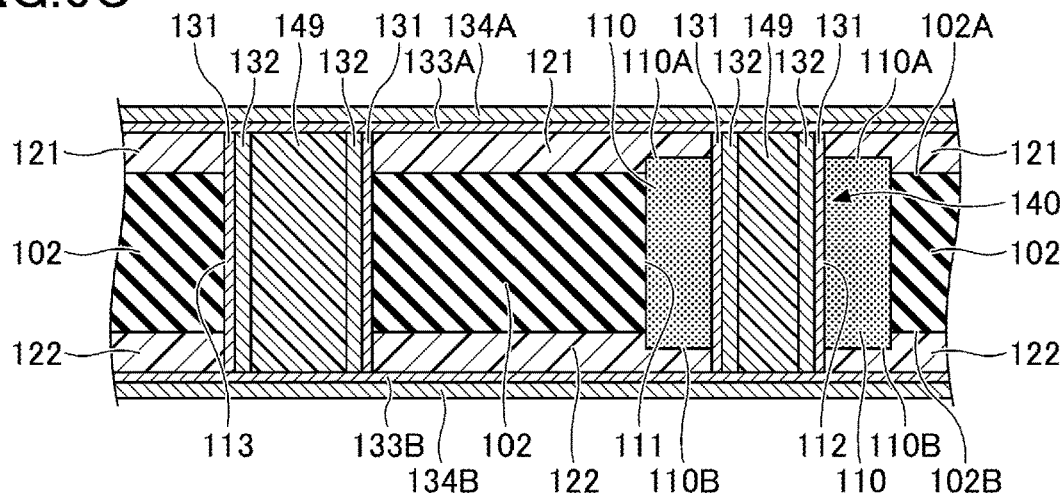

Next, as illustrated in FIG. 6C, the electroless copper plating film 133A is formed on the surface of the first insulating layer 121, and on the surfaces of the electroless copper plating film 131, the electrolytic copper plating film 132, and the filler material 149 coinciding with the surface of the first insulating layer 121. Similarly, the electroless copper plating film 133B is formed on the surface of the second insulating layer 122, and on the surfaces of the electroless copper plating film 131, the electrolytic copper plating film 132, and the filler material 149 coinciding with the surface of the second insulating layer 122. Then, the electrolytic copper plating film 134A is formed on the electroless copper plating film 133A, by electrolytic plating using the electroless copper plating film 133A as the plating feed line, and the electrolytic copper plating film 134B is famed on the electroless copper plating film 133B by electrolytic plating method using the electroless copper plating film 133B as the plating feed line. For example, the electroless copper plating films 133A and 133B may have thicknesses in a range of 0.3 µm to 1.0 µm, and the electrolytic copper plating films 134A and 134B may have thicknesses in a range of 15 µm to 40 µm.

Figure 7A:
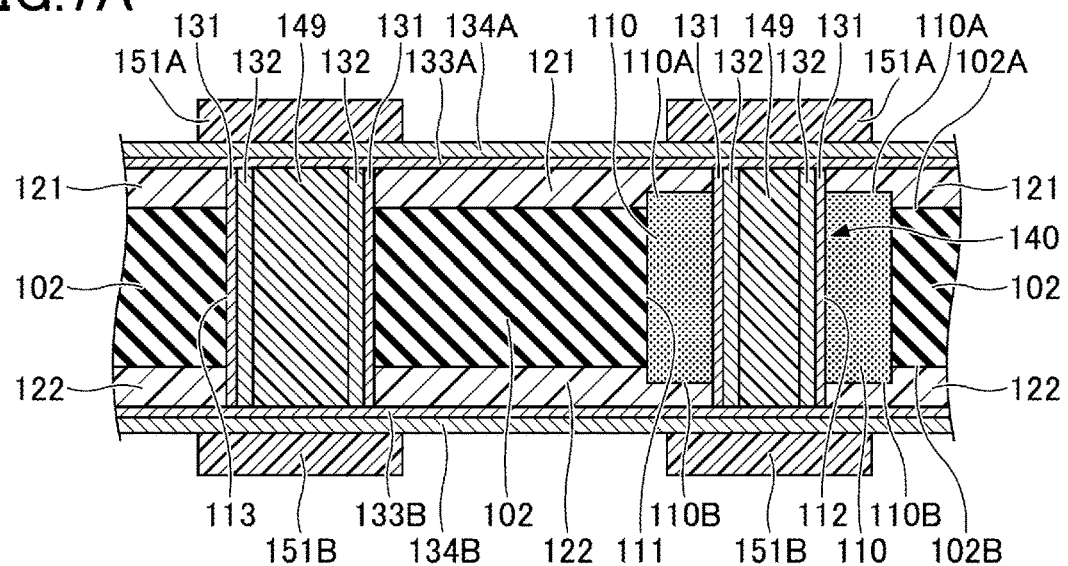
FIG. 7A, FIG. 7B, and FIG. 7C are cross sectional views (part 5) illustrating the method for manufacturing the wiring board according to the first embodiment.

Thereafter, as illustrated in FIG. 7A, a resist layer 151A, famed with a pattern of the first interconnect layer 141, is formed on the electrolytic copper plating film 134A, and a resist layer 151B, formed with a pattern of the second interconnect layer 142, is formed on the electrolytic copper plating film 134B. The resist layers 151A and 151B may be a dry film or the like, for example, and the pattern may be formed in the resist layers 151A and 151B by exposure and development.

Figure 7B:
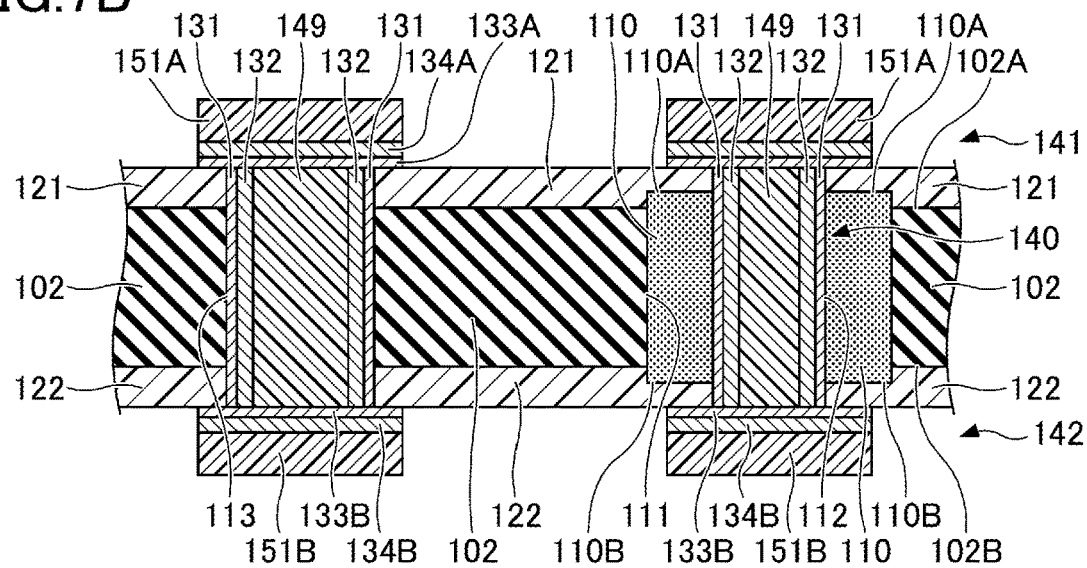

Next, as illustrated in FIG. 7B, the electrolytic copper plating film 134A and the electroless copper plating film 133A are wet etched, using the resist layer 151A as a mask, and the electrolytic copper plating film 134B and the electroless copper plating film 133B are wet etched, using the resist layer 151B as a mask. As a result, the first interconnect layer 141 and the second interconnect layer 142 are obtained. The first interconnect layer 141 includes the electroless copper plating film 133A and the electrolytic copper plating film 134A. The second interconnect layer 142 includes the electroless copper plating film 133B and the electrolytic copper plating film 134B.

Figure 7C:
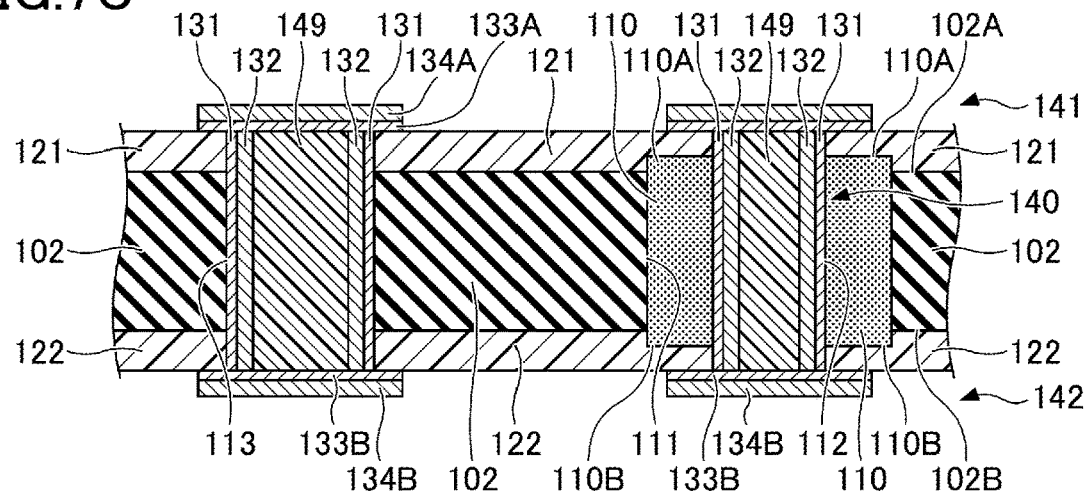

Then, as illustrated in FIG. 7C, the resist layers 151A and 151B are removed.

Next, an uncured resin film is adhered on the first insulating layer 121, so as to cover the first interconnect layer 141, and an uncured resin film is adhered on the second insulating layer 122, so as to cover the second interconnect layer 142. Thereafter, these resin films are cured by a heat treatment, to form the third insulating layer 123 and the fourth insulating layer 124 illustrated in FIG. 1. The third insulating layer 123 and the fourth insulating layer 124 may be formed of an insulating resin, such as an epoxy resin, a polyimide resin, or the like. The third insulating layer 123 and the fourth insulating layer 124 may be formed by coating a liquid resin. Then, by subjecting the third insulating layer 123 and the fourth insulating layer 124 to a laser beam machining, the via hole 161 reaching the connection portion of the first interconnect layer 141 is formed in the third insulating layer 123, and the via hole 162 reaching the connection portion of the second interconnect layer 142 is formed in the fourth insulating layer 124, as illustrated in FIG. 1.

Next, the third interconnect layer 143, which connects to the first interconnect layer 141 via the via conductor inside the via hole 161, is famed on the third insulating layer 123, and the fourth interconnect layer 144, which connects to the second interconnect layer 142 via the via conductor inside the via hole 162, is formed on the fourth insulating layer 124, as illustrated in FIG. 1.

The third interconnect layer 143 and the fourth interconnect layer 144 may be formed by a semi-additive method. A more detailed description will be given on the method of forming the third interconnect layer 143. First, a seed layer (not illustrated) made of copper or the like is formed on the third insulating layer 123, and on the inner surface of the via hole 161, by electroless plating or sputtering. Then, a plating resist layer (not illustrated), formed with an opening at the portion where the third interconnect layer 143 is to be formed, is formed on the seed layer. Further, a metal plating layer made of copper or the like is formed in the opening of the plating resist layer, by electrolytic plating using the seed layer as the plating feed line. Thereafter, the plating resist layer is removed. Then, the seed layer is removed by wet etching using the metal plated layer as a mask. In this manner, it is possible to form the third interconnect layer 143 including the seed layer and the metal plating layer. The fourth interconnect layer 144 may be formed in a similar manner to the third interconnect layer 143.

After the third interconnect layer 143 and the fourth interconnect layer 144 are formed, the fifth insulating layer 125, provided with the via hole 163 on the connection portion of the third interconnect layer 143, is formed on the third insulating layer 123, and the sixth insulating layer 126, provided with the via hole 164 on the connection portion of the fourth interconnect layer 144, is famed on the fourth insulating layer 124, as illustrated in FIG. 1. The fifth insulating layer 125 and the sixth insulating layer 126 may be formed in a similar manner to the third insulating layer 123 and the fourth insulating layer 124.

Further, the fifth interconnect layer 145, which connects to the third interconnect layer 143 via the via conductor inside the via hole 163, is famed on the fifth insulating layer 125, and the sixth interconnect layer 146, which connects to the fourth interconnect layer 144 via the via conductor inside the via hole 164, is formed on the sixth insulating layer 126, as illustrated in FIG. 1. The fifth interconnect layer 145 and the sixth interconnect layer 146 may be formed in a manner similar to the third interconnect layer 143 and the fourth interconnect layer 144.

Next, a solder resist layer 127 is formed on the fifth insulating layer 125, and a solder resist layer 128 is formed on the sixth insulating layer 126, as illustrated in FIG. 1. Thereafter, the opening 165, which reaches the connection portion of the fifth interconnect layer 145, is formed in the solder resist layer 127. In addition, an opening 166, which reaches the connection portion of the sixth interconnect layer 146, is formed in the solder resist layer 128.

The solder resist layer 127 and the solder resist layer 128 are formed of an insulating resin, such as a photosensitive epoxy resin, a photosensitive acrylic resin, or the like. The solder resist layer 127 and the solder resist layer 128 may be formed by adhering a resin film, or by coating a liquid resin. The opening 165 and the opening 166 may be formed by exposure and development. An insulating resin, such as a non-photosensitive epoxy resin, a non-photosensitive polyimide resin, or the like, may be used for the solder resist layer 127 and the solder resist layer 128. In this case, the opening 165 and the opening 166 may be formed by laser beam machining, blasting, or the like.

Next, the connection terminal 147, which protrudes above the solder resist layer 127 via the opening 165, is formed on the connection portion of the fifth interconnect layer 145. The connection terminal 147 may include the post and the bump.

Next, the structure, which is subjected to the processes up to the forming of the connection terminal 147, is cut along a predetermined cutting plane line by a slicer or the like. Hence, the structures respectively corresponding to the wiring board 100 are singulated from the large laminate 101, and a plurality of wiring boards 100 according to the first embodiment are obtained. The wiring board 100 according to the first embodiment can be manufactured in this manner.

According to the method for manufacturing the wiring board described above, the first interconnect layer 141 and the second interconnect layer 142 can be made thin, and can easily be subjected to a fine pattern lithography.

The desmear process using a desmear liquid may be performed after formation of the via holes 161 through 164. Because the surface of the magnetic material 110 is covered by the base 102, the first insulating layer 121, the second insulating layer 122, and the conductive layer 140, the magnetic material 110 is not exposed to the desmear liquid even if desmear process is performed. For this reason, it is possible to prevent the magnetic material 110 from being eroded by the desmear liquid.

In the method described method, the first interconnect layer 141 and the second interconnect layer 142 are formed by the subtractive method. However, the first interconnect layer 141 and the second interconnect layer 142 may be formed by the semi-additive method. When the first interconnect layer 141 and the second interconnect layer 142 are formed by the semi-additive method, the following processes may be performed.

That is, after polishing illustrated in FIG. 6B, the electroless copper plating film 133A is formed on the surface of the first insulating layer 121, and on the surfaces of the electroless copper plating film 131, the electrolytic copper plating film 132, and the filler material 149 coinciding with the surface of the first insulating layer 121, as the seed layer. Similarly, the electroless copper plating film 133B is formed on the surface of the second insulating layer 122, and on the surfaces of the electroless copper plating film 131, the electrolytic copper plating film 132, and the filler material 149 coinciding with the surface of the second insulating layer 122, as the seed layer.

Next, a plating resist layer (not illustrated), provided with an opening at the portion where the first interconnect layer 141 is to be formed, is formed on the electroless copper plating film 133A. Then, the electrolytic copper plating film 134A is formed in the opening of the plating resist layer, by electrolytic plating using the electroless copper plating film 133A as the plating feed line. Similarly, a plating resist layer (not illustrated), provided with an opening at a portion where the second interconnect layer 142 is to be formed, is formed on the electroless copper plating film 133B. Then, the electrolytic copper plating film 134B is formed in the opening of the plating resist layer, by electrolytic plating using the electroless copper plating film 133B as the plating feed line. Thereafter, the plating resist layers are removed.

Next, the electrolytic copper plating film 134A is used as a mask, to remove a portion of the electroless copper plating film 133A exposed from the electrolytic copper plating film 134A, by wet etching. As a result, the first interconnect layer 141, including the electroless copper plating film 133A and the electrolytic copper plating film 134A, is obtained. Similarly, the electrolytic copper plating film 134B is used as a mask, to remove a portion of the electroless copper plating film 133B exposed from the electrolytic copper plating film 134B, by wet etching. As a result, the second interconnect layer 142, including the electroless copper plating film 133B and the electrolytic copper plating film 134B, is obtained.

Second Embodiment

Next, a second embodiment will be described. The second embodiment differs from the first embodiment mainly in the structure of the conductive layer, the first interconnect layer, and the second interconnect layer.

[Structure of Wiring Board]

Figure 8:
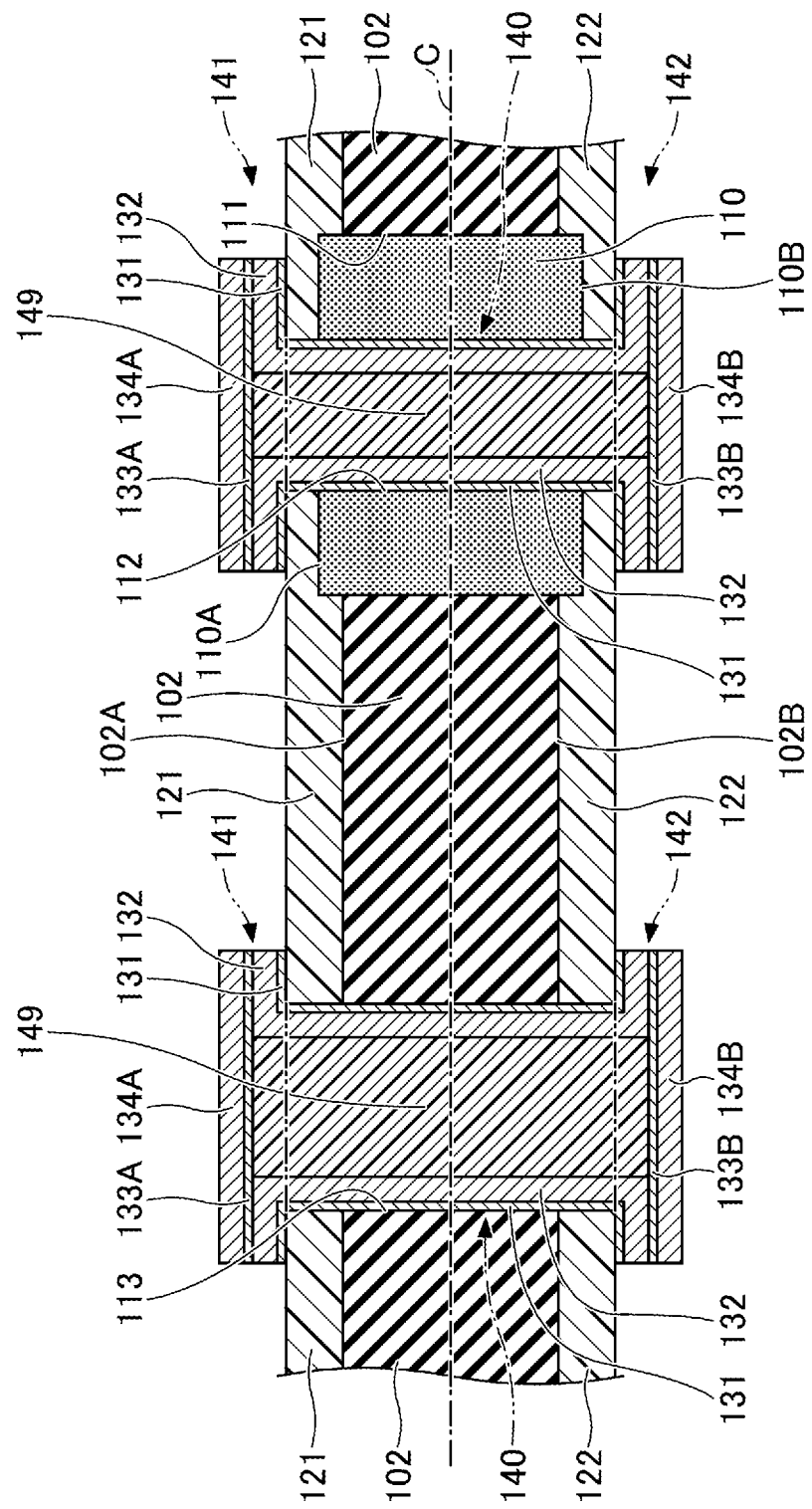
FIG. 8 is a cross sectional view illustrating the conductive layer, the first interconnect layer, and the second interconnect layer according to a second embodiment.

First, the structure of the wiring board will be described. FIG. 8 is a cross sectional view illustrating the conductive layer 140, the first interconnect layer 141, and the second interconnect layer 142 according to the second embodiment.

As illustrated in FIG. 8, in the second embodiment, the conductive layer 140 includes portions of the electroless copper plating film 131 and the electrolytic copper plating film 132 formed on the surface of the first insulating layer 121 and the surface of the second insulating layer 122.

The first interconnect layer 141 includes the electroless copper plating film 133A, and the electrolytic copper plating film 134A. The first interconnect layer 141 further includes portions of the electroless copper plating film 131 and the electrolytic copper plating film 132 which are on the outer side of the surface of the first insulating layer 121.

The second interconnect layer 142 includes an electroless copper plating film 133B, and the electrolytic copper plating film 134B. The second interconnect layer 142 further includes portions of the electroless copper plating film 131 and the electrolytic copper plating film 132 which are on the outer side of the surface of the second insulating layer 122.

The structure of other portions of the second embodiment are similar to those of the first embodiment.

Effects similar to those obtainable by the first embodiment can also be obtained by the second embodiment.

[Method for Manufacturing Wiring Board]

Next, the method for manufacturing the wiring board according to the second embodiment will be described. FIG. 9A through FIG. 10B are cross sectional views illustrating the method for manufacturing the wiring board according to the second embodiment.

Figure 9A:
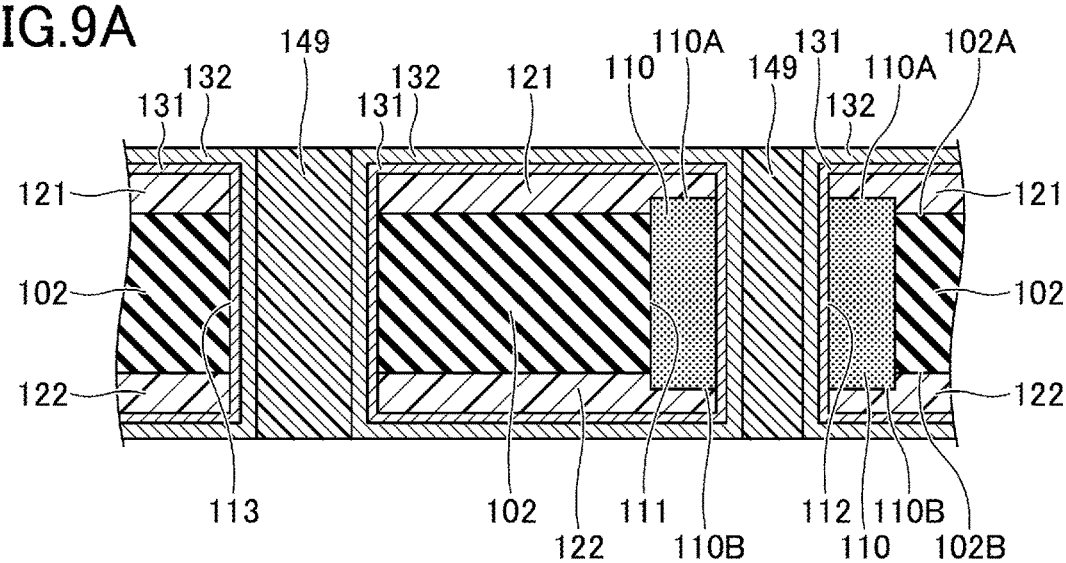
FIG. 9A, FIG. 9B, and FIG. 9C are cross sectional views (part 1) illustrating the method for manufacturing the wiring board according to the second embodiment.

First, the processes up to the filling of the filler material 149 is performed in a manner similar to those of the first embodiment, as illustrated in FIG. 6A. Then, as illustrated in FIG. 9A, the portions of the filler material 149, protruding from the surfaces of the electrolytic copper plating film 132 on both sides of the base 102, are removed by polishing. For example, the protruding portions of the filler material 149 can be removed by buffing or roll polishing. As a result, the filler material 149 has the surface which coincides with the surface of the electrolytic copper plating film 132 on the side closer to the first principal surface 102A, and the surface which coincides with the surface of the electrolytic copper plating film 132 on the side closer to the second principal surface 102B. Thereafter, a desmear process is performed on the surfaces of the electrolytic copper plating film 132.

Figure 9B:
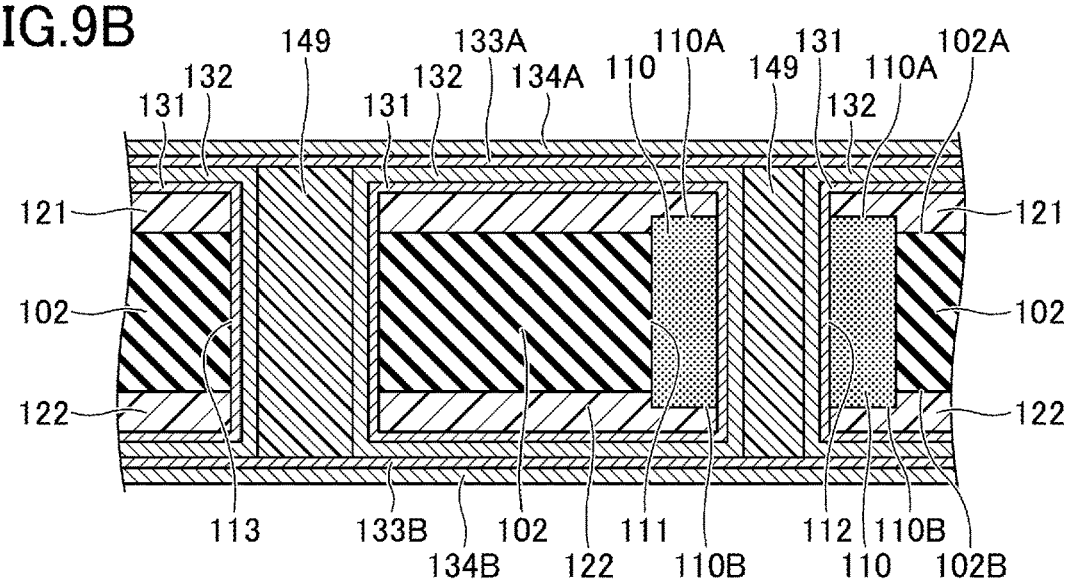

Then, as illustrated in FIG. 9B, the electroless copper plating film 133A is formed on the surface of the electrolytic copper plating film 132, and on the surface of the filler material 149 coinciding with the surface of the electrolytic copper plating film 132, on the side closer to the first principal surface 102A of the base 102. Similarly, the electroless copper plating film 133B is famed on the surface of the electrolytic copper plating film 132, and on the surface of the filler material 149 coinciding with the surface of the electrolytic copper plating film 132, on the side closer to the second principal surface 102B of the base 102. Furthermore, the electrolytic copper plating film 134A is formed on the electroless copper plating film 133A, by electrolytic plating using the electroless copper plating film 133A as the plating feed line, and the electrolytic copper plating film 134B is formed on the electroless copper plating film 133B, by electrolytic plating using the electroless copper plating film 133B as the plating feed line.

Figure 9C:
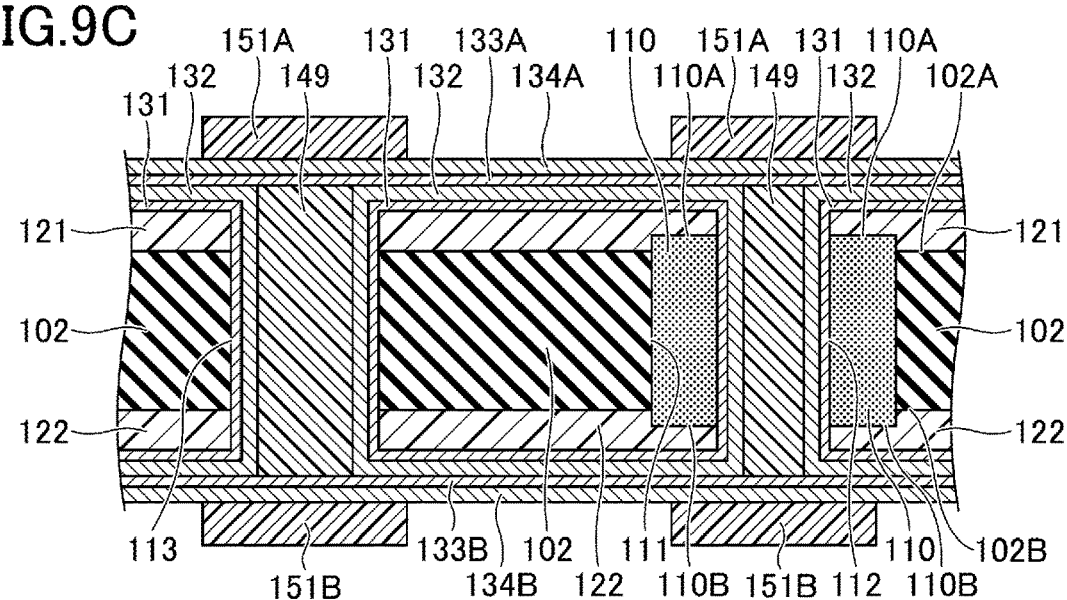

Thereafter, as illustrated in FIG. 9C, the resist layer 151A is formed on the electrolytic copper plating film 134A, and the resist layer 151B is formed on the electrolytic copper plating film 134B, similar to the first embodiment.

Figure 10A:
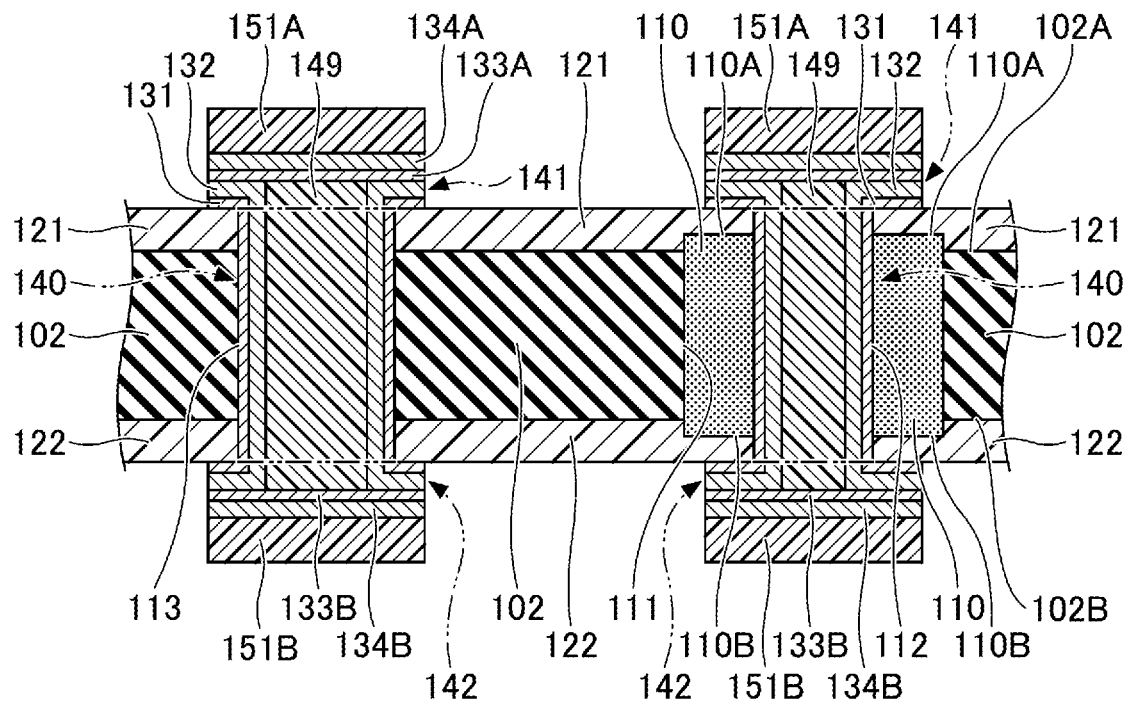
FIG. 10A and FIG. 10B are cross sectional views (part 2) illustrating the method for manufacturing the wiring board according to the second embodiment.

Next, as illustrated in FIG. 10A, the resist layer 151A is used as a mask, to etch the electrolytic copper plating film 134A, the electroless copper plating film 133A, the electrolytic copper plating film 132, and the electroless copper plating film 131. In addition, the resist layer 151B is used as a mask, to etch the electrolytic copper plating film 134B, the electroless copper plating film 133B, the electrolytic copper plating film 132, and the electroless copper plating film 131. As a result, the first interconnect layer 141 and the second interconnect layer 142 are obtained.

Figure 10B:
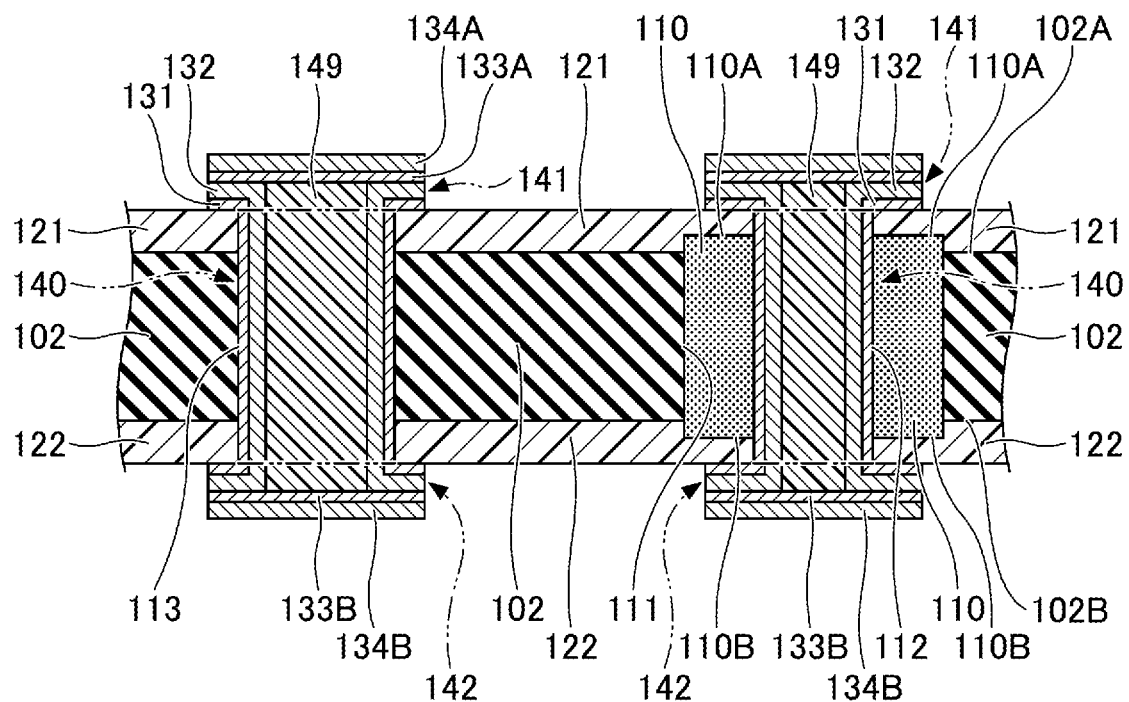

Then, as illustrated in FIG. 10B, the resist layer 151A and the resist layer 151B are removed. Thereafter, the processes of forming the third insulating layer 123 and the fourth insulating layer 124, and subsequent processes, are performed similar to the first embodiment.

The wiring board according to the second embodiment can be manufactured in this manner.

Third Embodiment

Next, a third embodiment will be described. The third embodiment differs from the first embodiment mainly in the structure of the magnetic material.

[Structure of Wiring Board]

Figure 11:
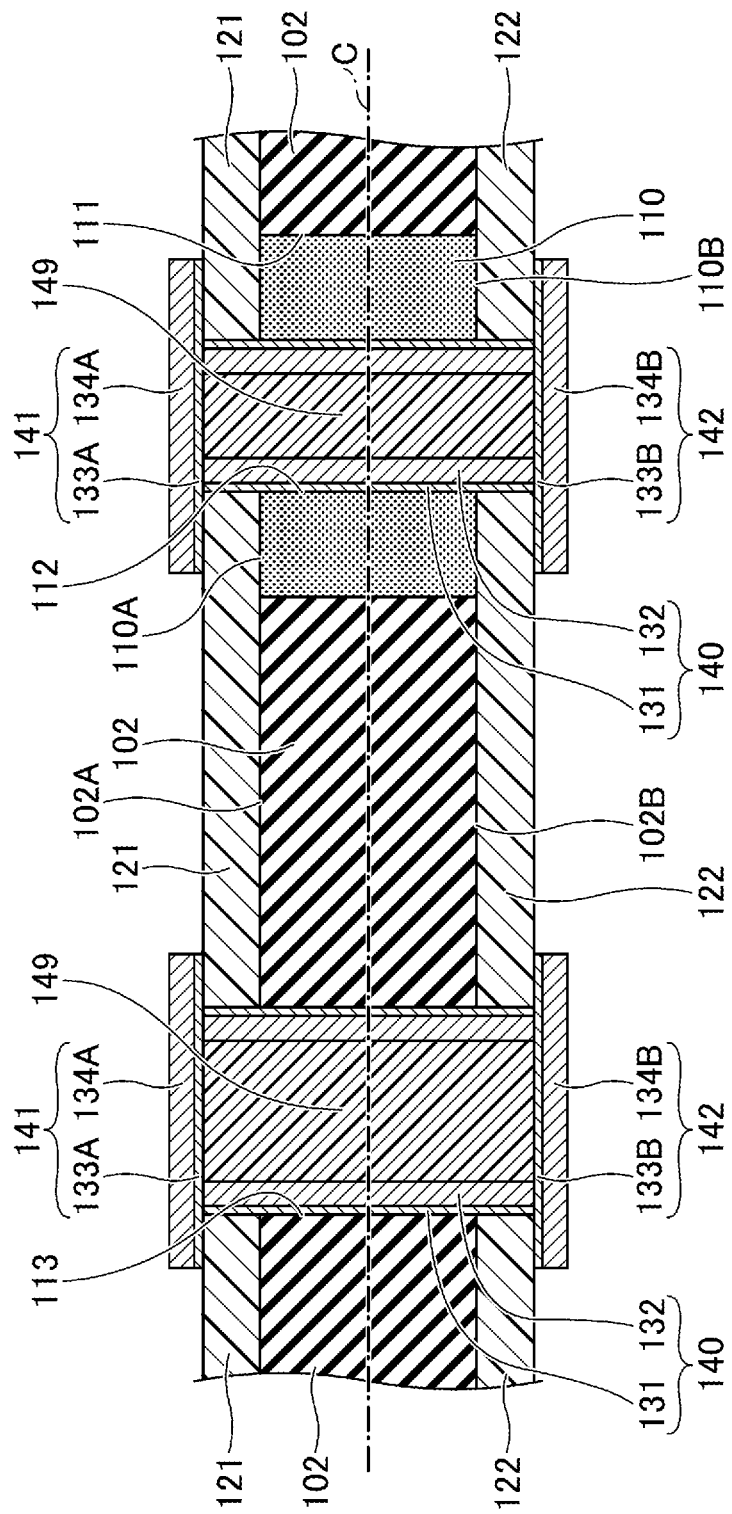
FIG. 11 is a cross sectional view illustrating a magnetic material according to a third embodiment.

First, the structure of the wiring board will be described. FIG. 11 is a cross sectional view illustrating the magnetic material 110 according to the third embodiment.

As illustrated in FIG. 11, in the third embodiment, the thickness of the magnetic material 110 is the same as the thickness of the base 102. The first surface 110A of the magnetic material 110 coincides with the first principal surface 102A, and the second surface 110B of the magnetic material 110 coincides with the second principal surface 102B. That is, the distance from the center C along the thickness direction of the base 102 to the first surface 110A, is equal to the distance from the center C to the first principal surface 102A. In addition, the distance from the center C to the surface 110B, is equal to the distance from the center C to the second principal surface 102B.

The structure of other portions of the third embodiment are similar to those of the first embodiment.

Effects similar to those obtainable by the first embodiment can also be obtained by the third embodiment.

[Method for Manufacturing Wiring Board]

Next, the method for manufacturing the wiring board according to the third embodiment will be described. FIG. 12A through FIG. 13B are cross sectional views illustrating the method for manufacturing the wiring board according to the third embodiment.

Figure 12A:
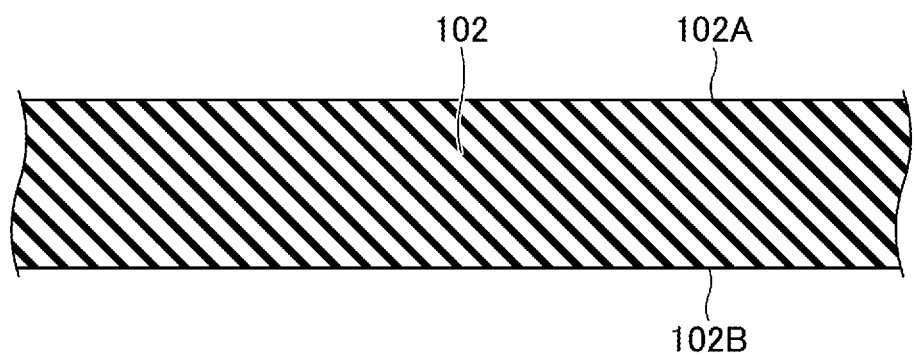
FIG. 12A and FIG. 12B are cross sectional views (part 1) illustrating the method for manufacturing the wiring board according to a third embodiment.

First, as illustrated in FIG. 12A, the insulating base 102 without the conductive films 103A and 103B is prepared. The large substrate from which a plurality of wiring boards can be singulated, may be used as the base 102. That is, the base 102 includes a plurality of regions (or areas) where structures, respectively corresponding to the wiring board 100, are formed.

Figure 12B:
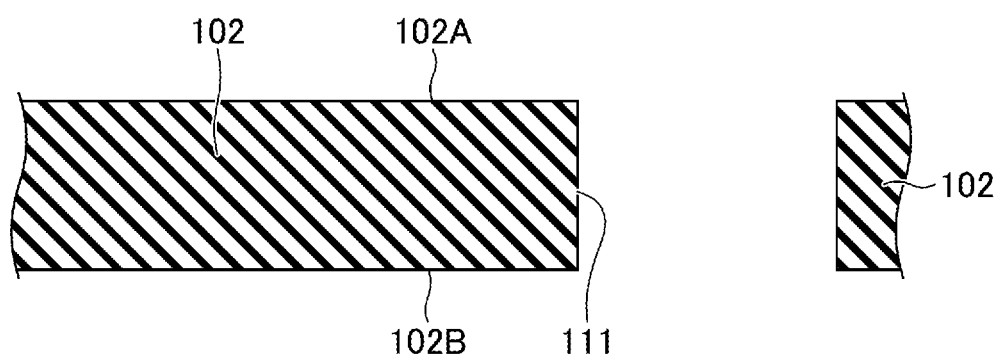

Next, as illustrated in FIG. 12B, the first through hole 111 is formed in the base 102. For example, the first through hole 111 may be formed by drilling, laser beam machining, or the like. Thereafter, a desmear process is performed on the wall surface of the first through hole 111.

Figure 13A:
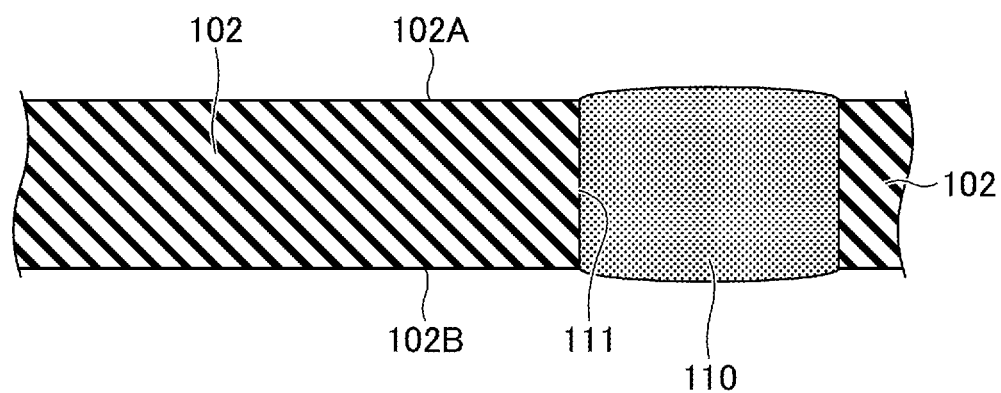
FIG. 13A and FIG. 13B are cross sectional views (part 2) illustrating the method for manufacturing the wiring board according to the third embodiment.

Then, as illustrated in FIG. 13A, the magnetic material 110 is filled inside the first through hole 111.

Figure 13B:
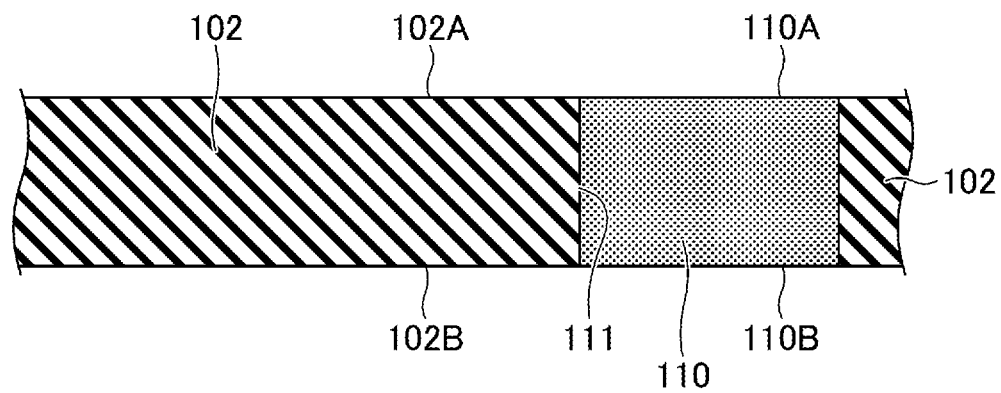

Next, as illustrated in FIG. 13B, the portions of the magnetic material 110, protruding from the first principal surface 102A and the second principal surface 102B of the base 102, are removed by polishing. For example, the protruding portions of the magnetic material 110 may be removed by buffing or roll polishing. The magnetic material 110, after the polishing, includes the first surface 110A coinciding with the first principal surface 102A, ad the second surface 110B coinciding with the second principal surface 102B. Thereafter, the processes of forming the first insulating layer 121 and the second insulating layer 122, and subsequent processes, are performed similar to the first embodiment.

The wiring board according to the third embodiment can be manufactured in this manner.

Fourth Embodiment

Next, a fourth embodiment will be described. The fourth embodiment differs from the second embodiment mainly in the structure of the magnetic material.

[Structure of Wiring Board]

First, the structure of the wiring board will be described. FIG. 14 is a cross sectional view illustrating the magnetic material 110 according to the fourth embodiment.

As illustrated in FIG. 14, in the fourth embodiment, the thickness of the magnetic material 110 is the same as the thickness of the base 102, similar to the third embodiment. The first surface 110A of the magnetic material 110 coincides with the first principal surface 102A, and the second surface 110B of the magnetic material 110 coincides with the second principal surface 102B. That is, the distance from the center C along the thickness direction of the base 102 to the first surface 110A, is equal to the distance from the center C to the first principal surface 102A. In addition, the distance from the center C to the second surface 110B, is equal to the distance from the center C to the second principal surface 102B.

The structure of other portions of the fourth embodiment are similar to those of the second embodiment.

Effects similar to those obtainable by the second embodiment can also be obtained by the third embodiment.

[Method for Manufacturing Wiring Board]

Next, the method for manufacturing the wiring board according to the fourth embodiment will be described.

First, the insulating base 102 without the conductive films 103A and 103B is prepared, similar to the third embodiment. Then, the processes from the formation of the first through hole 111 to the polishing of the magnetic material 110 are performed, similar to the third embodiment. Thereafter, the processes of forming the first insulating layer 121 and the second insulating layer 122, and subsequent processes, are performed similar to the second embodiment.

The wiring board according to the fourth embodiment can be manufactured in this manner.

Fifth Embodiment

Figure 15:
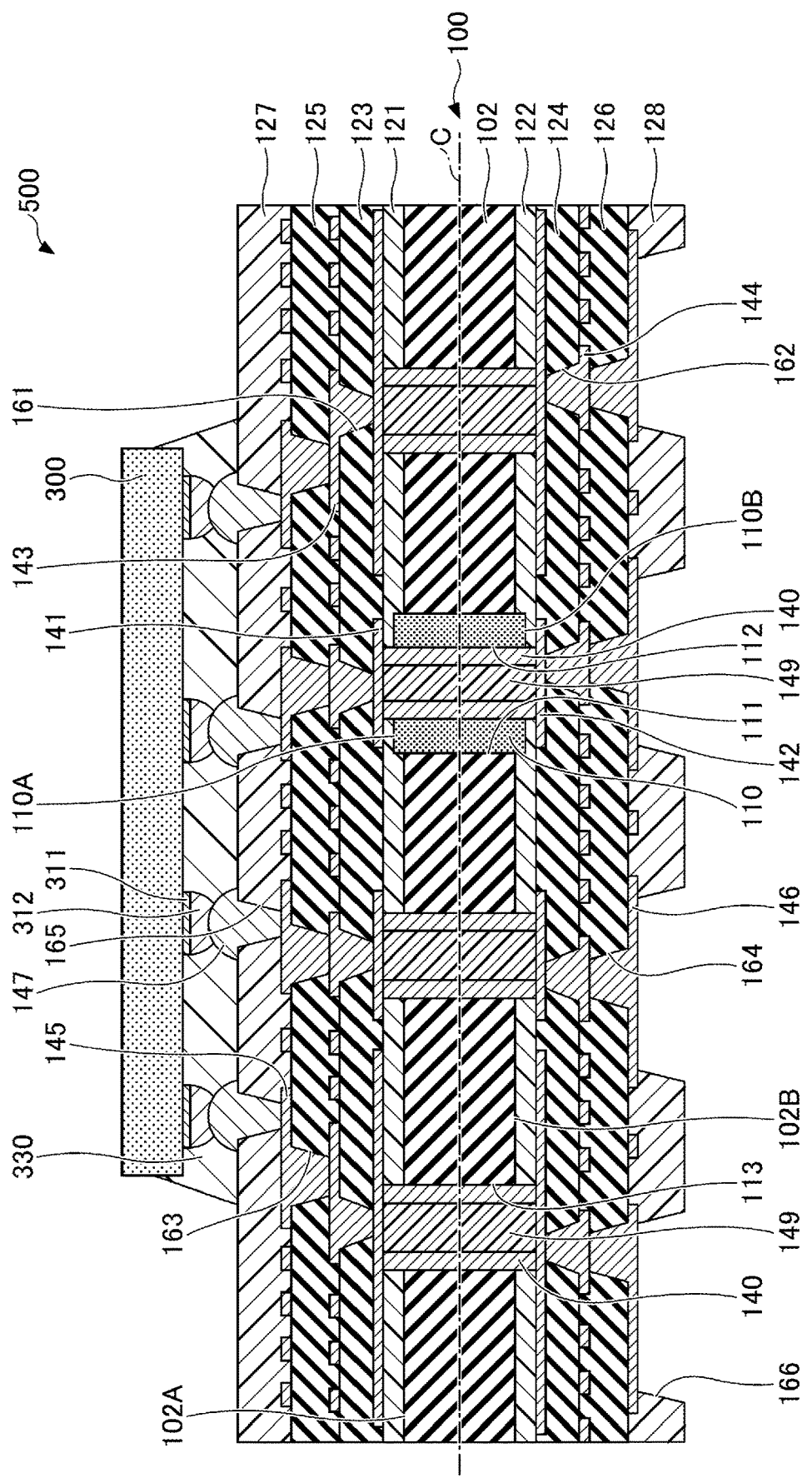
FIG. 15 is a cross sectional view illustrating a semiconductor package according to a fifth embodiment.

Next, a fifth embodiment will be described. The fifth embodiment relates to a semiconductor package. FIG. 15 is a cross sectional view illustrating a semiconductor package 500 according to the fifth embodiment.

As illustrated in FIG. 15, the semiconductor package 500 according to the fifth embodiment includes the wiring board 100 according to the first embodiment, a semiconductor chip 300, bumps 312, and an underfill resin 330.

The semiconductor chip 300 includes connection terminals 311 which connect to the connection terminals 147 via the bumps 312. The connection terminals 311 are electrode pads, for example. Solder balls may be used for the bumps 312, for example. Examples of the solder ball material include Pb-free solders, such as tin silver (SnAg) based alloys, tin zinc (SnZn) based alloys, tin copper (SnCu) based alloys, or the like, and lead-based solders such as lead tin (PbSn) based alloys or the like. The underfill resin 330, such as an epoxy resin or the like, is filled in between the semiconductor chip 300 and the solder resist layer 127 of the wiring board 100.

When manufacturing the semiconductor package 500, the singulated wiring board 100 is prepared, and the bumps 312 are used to mount the semiconductor chip 300 onto the wiring board 100 by flip-chip bonding. After mounting the semiconductor chip 300 on the wiring board 100, the underfill resin 330 is filled in between the semiconductor chip 300 and the solder resist layer 127.

The semiconductor package 500 according to the fifth embodiment can be manufactured in this manner.

The wiring board according to one of the second, third, and fourth embodiments may be used in place of the wiring board 100 according to the first embodiment.

In the present disclosure, the magnetic material 110 is an example of a functional material, and the functional material is not limited to the magnetic material.

In the present disclosure, the material of the conductive layer is not limited to copper, and the conductive layer may include a plating film of other metals, such as nickel or the like.

Accordingly to each of the embodiments described above, it is possible to provide a wiring board having a fine interconnect layer, and a method for manufacturing the wiring boards.

Various aspects of the subject-matter described herein may be set out non-exhaustively in the following numbered clauses:

1. A method of manufacturing a wiring board, comprising:
   forming a first through hole in an insulating base having a first principal surface and a second principal surface opposite to the first principal surface, the first through hole penetrating the insulating base from the principal surface to the second principal surface;
   providing a functional material inside the first through hole;
   forming a first insulating layer covering the first principal surface, and a first surface of the functional material on the side closer to the first principal surface;
   forming a second insulating layer covering the second principal surface, and a second surface of the functional material on the side closer to the second principal surface;
   forming a second through hole in the first insulating layer, the functional material, and the second insulating layer;
   providing a conductive layer on a wall surface of the second through hole.

2. The method for manufacturing the wiring board according to clause 1, wherein the forming the conductive layer includes forming an electroless plating film on a surface of the first insulating layer, a surface of the second insulating layer, and the wall surface of the second through hole, forming an electrolytic plating film on the electroless plating film, polishing the electrolytic plating film and the electroless plating film until the surface of the first insulating layer is exposed, and polishing the electrolytic plating film and the electroless plating film until the surface of the second insulating layer is exposed.

3. The method for manufacturing the wiring board according to clause 1 or 2, further comprising:

forming a first interconnect layer on the first insulating layer, the first interconnect layer connecting to the conductive layer; and forming a second interconnect layer on the second insulating layer, the second interconnect layer connecting to the conductive layer.

4. The method for manufacturing the wiring board according to any one of clauses 1 to 3, further comprising:

filling the second through hole with an insulating filler material on an inner side of the conductive layer.

5. The method for manufacturing the wiring board according to any one of clauses 1 to 4, wherein the functional material includes a magnetic material.

Although the embodiments are numbered with, for example, "first," "second," "third," "fourth," or "fifth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
an insulating base including a first principal surface, a second principal surface opposite to the first principal surface, and a first through hole penetrating the insulating base from the first principal surface to the second principal surface;
a functional material provided inside the first through hole;
a first insulating layer covering the first principal surface, and a first surface of the functional material on the side closer to the first principal surface;
a second insulating layer covering the second principal surface, and a second surface of the functional material on the side closer to the second principal surface;
a second through hole penetrating the first insulating layer, the functional material, and the second insulating layer;
a conductive layer formed on a wall surface of the second through hole;
a first interconnect layer connected to the conductive layer, and covering a first end surface of the conductive layer on the side closer to the first principal surface, and a third surface of the first insulating layer; and
a second interconnect layer connected to the conductive layer, and covering a second end surface of the conductive layer on the side closer to the second principal surface, and a fifth surface of the second insulating layer, wherein the third surface of the first insulating layer is located on an opposite side from a fourth surface of the first insulating layer covering the first principal surface, and coincides with the first end surface of the conductive layer, the fifth surface of the second insulating layer is located on an opposite side from a sixth surface of the second insulating layer covering the second principal surface, and coincides with the second end surface of the conductive layer, the first interconnect layer includes a first electroless plating layer, and a first electrolytic plating layer, which are laminated, the first electroless plating layer is formed on the third surface of the first insulating layer, and on the first end surface of the conductive layer, the first electrolytic plating layer is laminated on the first electroless plating layer, the second interconnect layer includes a second electroless plating layer, and a second electrolytic plating layer, which are laminated, the second electroless plating layer is formed on the fifth surface of the second insulating layer, and on the second end surface of the conductive layer, and the second electrolytic plating layer is laminated on the second electroless plating layer.

2. The wiring board as claimed in claim 1, further comprising:

an insulating filler filling the second through hole on an inner side of the conductive layer.

3. The wiring board as claimed in claim 1, wherein the functional material includes a magnetic material.

4. The wiring board as claimed in claim 1, wherein the conductive layer includes an electroless plating layer, and an electrolytic plating layer, which are laminated.

5. The wiring board as claimed in claim 1, wherein the first surface of the functional material protrudes from the first principal surface of the insulating base, and the second surface of the functional material protrudes from the second principal surface of the insulating base.

6. The wiring board as claimed in claim 1, wherein the first surface of the functional material coincides with the first principal surface of the insulating base, and the second surface of the functional material coincides with the second principal surface of the insulating base.

7. The wiring board as claimed in claim 2, wherein the first interconnect layer covers a first end surface of the insulating filler on the side closer to the first principal surface, the first end surface of the insulating filler coincides with the first end surface of the conductive layer, the second interconnect layer covers a second end surface of the insulating filler on the side closer to the second principal surface, and the second end surface of the insulating filler coincides with the second end surface of the conductive layer.

8. A wiring board comprising:
an insulating base including a first principal surface, a second principal surface opposite to the first principal surface, and a first through hole penetrating the insulating base from the first principal surface to the second principal surface;
a functional material provided inside the first through hole;
a first insulating layer covering the first principal surface, and the functional material so that the functional material is not exposed on the side closer to the first principal surface;
a second insulating layer covering the second principal surface, and the functional material so that the functional material is not exposed on the side closer to the second principal surface;
a second through hole penetrating the first insulating layer, the functional material, and the second insulating layer;
a conductive layer formed on a wall surface of the second through hole, and on a first surface of the first insulating layer located on an opposite side from a second surface of the first insulating layer covering the first principal surface; and
a first interconnect layer connected to the conductive layer, and covering a first end surface of the conductive layer on the side closer to the first principal surface, wherein
a third surface of the functional material on the side closer to the first principal surface protrudes from the first principal surface of the insulating base, and
a fourth surface of the functional material on the side closer to the second principal surface protrudes from the second principal surface of the insulating base.

9. The wiring board as claimed in claim 8, further comprising:
a second interconnect layer connected to the conductive layer, and covering a second end surface of the conductive layer on the side closer to the second principal surface.

10. The wiring board as claimed in claim 8, further comprising:
an insulating filler filling the second through hole on an inner side of the conductive layer.

11. The wiring board as claimed in claim 8, wherein the functional material includes a magnetic material.

12. The wiring board as claimed in claim 8, wherein the conductive layer includes an electroless plating layer, and an electrolytic plating layer, which are laminated.

13. The wiring board as claimed in claim 9, wherein
the first interconnect layer includes a first electroless plating layer, and a first electrolytic plating layer, which are laminated, and
the second interconnect layer includes a second electroless plating layer, and a second electrolytic plating layer, which are laminated.

14. The wiring board as claimed in claim 8, further comprising:
an insulating filler filling the second through hole on an inner side of the conductive layer, wherein
the first interconnect layer covers an end surface of the insulating filler on the side closer to the first principal surface, and
the end surface of the insulating filler coincides with the first end surface of the conductive layer.

* * * * *